United States Patent [19]
Feher

[11] Patent Number: 5,491,457
[45] Date of Patent: Feb. 13, 1996

[54] F-MODULATION AMPLIFICATION

[76] Inventor: Kamilo Feher, 44685 Country Club Dr., El Macero, Calif. 95618

[21] Appl. No.: 370,117

[22] Filed: Jan. 9, 1995

[51] Int. Cl.⁶ .............................. H03C 3/00; H04L 27/12; H04L 27/20
[52] U.S. Cl. .......................... 332/103; 332/100; 375/302; 375/305; 375/308
[58] Field of Search ..................................... 332/100, 101, 332/102, 103–105; 375/261, 271–284, 298, 302–308

[56] References Cited

U.S. PATENT DOCUMENTS

| | | | |
|---|---|---|---|
| 4,339,724 | 7/1982 | Feher | 327/129 |
| 4,567,602 | 1/1986 | Kato et al. | 375/296 |
| 4,644,565 | 2/1987 | Seo et al. | 375/296 |
| 4,680,777 | 7/1987 | Saha | 332/103 X |
| 4,849,990 | 7/1989 | Ikegami et al. | 375/279 X |

FOREIGN PATENT DOCUMENTS

| | | |
|---|---|---|
| 1130871 | 8/1982 | Canada . |
| 1211517 | 9/1986 | Canada . |

OTHER PUBLICATIONS

Atienza et al., "2.4 GHz GaAs MMIC Experimental Results of FQPSK and DQPSK," IEEE 802.11 Wireless Access Method and Physical Layer Specifications, Doc. IEEE P802.11–94/52, Mar. 1994, pp. 1–11.

Brown, "Building up smart wireless blocks," *Electronic Engineering Times*, Apr. 1994, pp. 20, 21, 36.

Brown, "Low Power Implementation of FQPSK Chip for Infrared and other Wireless Systems," IEEE 802.11 Wireless Access Method and Physical Layer Specifications, Doc. IEEE P80.11–94/146, Jul. 1994, pp. 1–18.

Guo et al., "Proposed Modulation and Data Rate for Higher Speed Frequency Hopped Spread Spectrum (HS–FH–SS) Standard", IEEE P802.11–94, Jan. 1994, pp. 1–7.

Just et al., "FQPSK–Siemens Components for Exirlan Infrared (IR), Wireless IEEE 802.11 Radio, Other European, American, and International Standards," IEEE 802.11 Wireless Access Method and Physical Layer Specifications, Doc. IEEE P802.11–94, Mar. 1994, pp. 1–5.

Kato et al., "Performance of OQPSK and Equivalent FQPSK–KF for the DS–SS Sysem," IEEE 802.11 Wireless Access Method and Physical Layer 3Specifications, Doc. IEEE P802.11–93/189, Nov. 1993, pp. 1–6.

Mehdi and Feher, "DBPSK Compatible Power Efficient NLA Technique (1 watt) for DS–SS", IEEE 802.11–94/04, Jan. 1994, pp. 1–4.

*Primary Examiner*—David Mis
*Attorney, Agent, or Firm*—Steven F. Caserza; Flehr, Hohbach, Test, Albritton & Herbert

[57] ABSTRACT

Binary and Quadrature Feher's (F)-Modulation/Amplification with significantly reduced envelope fluctuations and peak radiation, increased power efficiency and transmit power delivered by connected RF (radio frequency), Infrared (IR) and other devices. A subclass of these systems has a constant envelope. Extraordinary power advantages, robust BER performance and linearly or nonlinearly amplified narrow spectrum without the pitfalls of conventional BPSK and DBPSK is attained. The FBPSK improved efficiency transmitter is compatible with conventional BPSK receivers. FBPSK modems are based on using quadrature structure where Q channel data is inserted in quadrature with I channel data. The Q channel data is the same as the I channel but is offset by one half bit (Tb/2). Further improvement in the spectrum is attained using correlation between I and Q channels. FBPSK modem is shown to meet the IEEE 802.11 specified spectral mask (−30 dB point) for wireless LAN, and leads output power gain of 6.5 dB over BPSK modems. The Crosscoupled Quadrature Structure is also suitable for digital and for analog frequency modulation (Feher's Frequency Modulation). Reduced modulation index Gaussian FSK (GFSK), multilevel FM and crosscoupled Quadrature Amplitude Modulated (QAM) transmitters and combinations of these modulations and corresponding coherent demodulators are described.

30 Claims, 14 Drawing Sheets

F-MODULATION AMPLIFICATION

BACKGROUND OF THE INVENTION

1. Field of the Invention

This invention relates to signal processors and particularly to crosscoupled signal processors for increasing the spectral and power efficiency of modulated NRZ (non return to zero) signals, of digital multilevel and of analog modulated signals in power efficient partly-linearized and nonlinearly amplified systems. Crosscoupled binary, quadrature phase, frequency and amplitude modulated systems are described.

BACKGROUND

In radio, infrared, cable, fiber optics and practically all communication transmission systems, power and spectral efficiency combined with robust bit error rate (BER) performance in a noisy and/or strong interference environment is a most desirable system requirement. Robust BER performance is frequently expressed in terms of the BER as a function of Energy per Bit ($E_b$) divided by Noise Density ($N_o$), that is, by the BER=$f(E_b/N_o)$ expression. Cost, reduced size, compatibility and interoperability with other conventional or standardized systems is highly desired. Several recently-developed draft standards have adopted modulation techniques such as conventional binary phase shift keying (BPSK), quadrature phase shift keying (QPSK), and π/4-QPSK techniques including differential encoding variations of the same. For spectrally-efficient (i.e. bandlimited) signalling, these conventional methods exhibit a large envelope fluctuation of the modulated signal, and thus a large increase in peak radiation relative to the average radiated power. Within the present state of the art, for numerous transmitter applications, it is not practical to introduce bandpass filtering after the radio frequency (RF) final amplifier stage. Here we are using the term "radio frequency" in its broadest sense, implying that we are dealing with a modulated signal. The RF could be, for example, as high as the frequency (inverse of the wavelength) of infrared or fiber optic transmitters, it could be in the GHz range, e.g., between 1 GHz and 100 GHz, or it could be in the MHz range or just in the kHz range.

In conventional BPSK and differentially-encoded phase-shift keying systems such as DBPSK and DQPSK, large envelope fluctuations require linearized or highly linear transmitters including upconverters and RF power amplifiers and may require expensive linear receivers including linear automatic gain control (AGC) circuits. A transmitter nonlinear amplifier (NLA) reduces the time domain envelope fluctuation of the bandlimited signal and this reduction of the envelope fluctuation, being a signal distortion, is the cause of spectral restoration or spectral regrowth and the cause of unacceptable high levels of out-of-band spectral energy transmission, also known as out-of-band interference. Additionally, for conventional BPSK, QPSK, and also QAM (Quadrature Amplitude Modulation) signals, in phase channel (I) to quadrature channel (Q) crosstalk is generated which degrades the BER=$f(E_b/N_o)$ performance of the modulated radio transmitter.

Experimental work, computer simulation, and theory documented in many recent publications indicates that for bandlimited and standardized BPSK, QPSK, π/4-QPSK, and QAM system specifications, a highly linear amplifier is required to avoid the pitfalls of spectral restoration and of BER degradation. Linearized or linear amplifiers are less power efficient (during the power "on" state, power efficiency is defined as the transmit RF power divided by DC power), considerably more expensive and/or have less transmit RF power capability, are larger in size, and are not as readily available as NLA amplifiers. As an illustrative example of technology achievements on two recently-released radio frequency integrated circuit (RFIC) amplifiers, we measured a maximum possible output power of 18 dBm in a linear mode of operation and as much as 24 dBm in a nonlinear or saturated mode of operation practically with the same DC current and DC power requirement at 2.4 GHz (Minicircuits amplifier MRFIC 2403). The RF power to DC drive power ratio, which is a practical measure of power-efficiency of an RF output stage, was doubled in the saturated mode. The reduced linearly amplified output power of 18 dBm is required to meet the stringent spectral efficiency requirements of the IEEE 802.11 direct sequence spread spectrum draft standard for conventional DBPSK and DQPSK operation, as depicted in FIG. 1. From FIG. 1 note that the linearly amplified filtered BPSK signal could meet the spectral specifications of this 11M chip/second system. The nonlinearly amplified, filtered BPSK of the prior art does not meet the specifications. The power efficiency (RF power to DC power ratio) of these systems in the "on" mode with linear low-cost commercial amplifiers driven by a 3V battery was found to be as low as 10%.

In an extremely critical power-efficient requirement such as all wireless and cellular telephones, computers, and other devices, it is very wasteful to operate at such low power efficiency, which leads to frequent replacement of the battery. The so-called "talk time" is not efficient with these very-recently standardized IEEE 802.11 modulated conventional BPSK and DQPSK systems. As a specific example, the out-of-band power spectral density is specified by the IEEE 802.11 US and international standard to be attenuated at least 30 dB at 11 MHz away from the carrier frequency for an 11M-chip/sec System as illustrated in FIG. 1, by the shaded area of specification limits. In simple modulated signal terms the 11 M-chip/sec rate is similar to an 11M-chip/sec DBPSK modulator. To satisfy this 30 dB out-of-band spectral density requirement, an "output backoff" (OBO) of the RF amplifiers of 4 dB to 6 dB is required. See K. Feher, "Wireless Digital Communications: Modulation and Spread Spectrum Techniques," book, Prentice Hall, 1995, and H. Mehdi, K. Feher, "FBPSK, Power and Spectrally Efficient Nonlinearly Amplified (NLA) Compatible BPSK Modems for Wireless LAN" submitted to RF Expo 95 San Diego proceedings to be published, March 1995 and H. Mehdi, K. Feher, "FQPSK, Power and Spectral Efficient Family of Modulations For Wireless Communication System." Proceeding IEEE-VTC-94, June 94, FIG. 2a depicts DBPSK modulation utilizing an amplifier (MRFIC 2403 available from Motorola) with an output power of approximately 18.5 dBm, which is linearly amplified with an output-backoff (OBO) of 5 dB.

FIG. 2b depicts a pre-modulation filtered conventional DBPSK signal operated at saturation at approximately 24 dBm, in which spectral restoration is evident. In FIG. 2c, the FBPSK modulated signal power is 24 dBm at full saturation, with 0 dB OBO. The term OBO is for the output power reduction required from the maximal or saturated output power of the amplifier. In this case saturated output power corresponds to 24 dBm while the 6 dB OBO reduces the output power from 24 dBm to only 18 dBm. The DC power consumption of the evaluated RF devices did not change significantly between the saturated full-output RF power and the 6 dB OBO reduced-output power. Thus if we could have a modulated system which could operate at full saturation of 24 dBm and meet the standardization requirements and specifications we could achieve approximately a 6 dB (400%) increased output power. Thus a modulation technique which could attain 24 dBm from existing RF devices and meet the standardized system specifications as well as the desired compatibility with conventional standardized BPSK or QPSK systems would be very attractive. To put things even more into perspective for this illustrative application, at 2.4 GHz FCC Part 15 permits transmission of 1 watt=+30 dBm transmit power. The IEEE 802.11 Standardization Committee specifies the same +30 dBm maximal output power. In a strongly interference polluted environment of the unregulated FCC-15 band it is very desirable to transmit the strongest possible and permitted RF signal in order to achieve good performance and the best possible coverage. With conventional BPSK modulators (such as specified by IEEE 802.11) utilizing linearly operated amplifier devices (such as a MRFIC 2403 amplifier available from Motorola) the practical achievable limit of output power is around +18 dBm to 20 dBm, which is about 10 dB less than permitted by the FCC and the IEEE standard. Thus, due to technology limitations, conventional modems must operate at an approximately 10 dB lower linearly amplified output power than permitted by FCC and allowed by the IEEE specification, for best performance.

SUMMARY OF THE INVENTION

The present invention avoids the tremendous technological gap between RF IC amplifiers and their use in, for example, PCMCIA (credit card sized 3V) system specifications. This invention alleviates the above weaknesses of wireless systems such as illustrated above for the 2.4 GHz band application. Similar advantages are obtained also for infrared and many other transmission systems. This invention presents the technology, method, structure, and functions to implement spectrally and power efficient crosscoupled Quadrature BPSK, QPSK, QAM, and FM systems such as nonlinearly amplified fully-saturated BPSK, which we call Feher's BPSK (FBPSK). The present invention teaches that FBPSK can operate with linear, partly nonlinear, and completely nonlinear amplified systems such as class C Or other classes of amplifiers and devices as well as nonlinear receivers. The FBPSK system of this invention has a tremendous power efficiency advantage over conventional BPSK and QPSK systems and retains the spectral efficiency and robust bit rate performance advantages of linearly amplified PSK systems. An additional advantage of FBPSK is that it is fully compatible and interoperable with some of the preliminary draft-standardized systems such as the IEEE 802.11 BPSK-based direct-sequence spread spectrum system. For practically the same cost power requirement, size, power dissipation, and bit error rate performance as the standardized BPSK, the present invention provides an approximately 400% (6 dB) output power advantage over the present state of the art, for comparable spectral efficiency. With the knowledge that 1 dB increase in RF power of 3V driven integrated circuits results in many millions of dollars of added R&D costs, this invention discloses a significant pioneering technology which will lead to considerably better performance and lower cost wireless and other communications, broadcast, consumer electronics, and variety of other applications which may include television, VCR remote applications, radio-controlled home security, medical uses, etc.

Health hazard caused by radio waves has been a recently-documented concern in the US and internationally. The FBPSK invention reduces the peak radiation of conventional BPSK by 6 dB to 9 dB which corresponds to two to three times reduction of peak radiation with the same average power as conventional BPSK. At this point in time medically it has not been proven that increased peak radiation is or could be truly harmful. However, even intuitively, it is apparent that given that in the prior art we transmit, say an average 1W power at 900 MHz and that the peak power of such a DBPSK signal would be 3W peak, while that of our invention having the same 1W average power would reduce the peak radiation to 1W. Thus in this illustrative case FBPSK reduces peak radiation threefold. Deployment of FBPSK instead of its compatible BPSK at the same average power authorized by FCC reduces the peak radiation of potentially millions of systems. It is believed that the reduction of peak radiation is a very important potential human health hazard reduction of which communications engineers and implementers should be aware.

BRIEF DESCRIPTION OF THE DRAWINGS

FIG. 3b is a diagram depicting one embodiment of baseband processing circuitry 103 of FIG. 3a;

FIG. 3c is a block diagram depicting one embodiment of a splitter circuit suitable for use as splitter 102 of FIG. 3a;

DETAILED DESCRIPTION

In general the present invention is a signal processor-filter having an input for receiving one or more input signals and providing one or more output signals which are cross coupled. The signal processor includes signal coupling between the in-phase and quadrature output signals of the baseband I and Q drive signals with means for generating BPSK, QPSK, Frequency Modulated (FM) and Quadrature Amplitude Modulated (QAM) digital and analog signals through a quadrature structure which is suitable for nonlinear amplification and demodulation by a conventional compatible BPSK demodulator or by coherent and noncoherent FM or QAM demodulators. In one of the specific embodiments, a digital communications application for nonlinearly amplified BPSK is illustrated, however the present invention is suitable for use with quadrature amplitude modulation (QAM), quadrature phase shift keying (QPSK), frequency shift keying (FSK), Gaussian FSK (GFSK), Gaussian Minimum Shift keying (GMSK), multilevel digital FM and many other digital as well as analog modulation systems. One of the first and simplest embodiments is for nonlinearly amplified BPSK which we call Feher's BPSK (FBPSK).

Figure 3A:
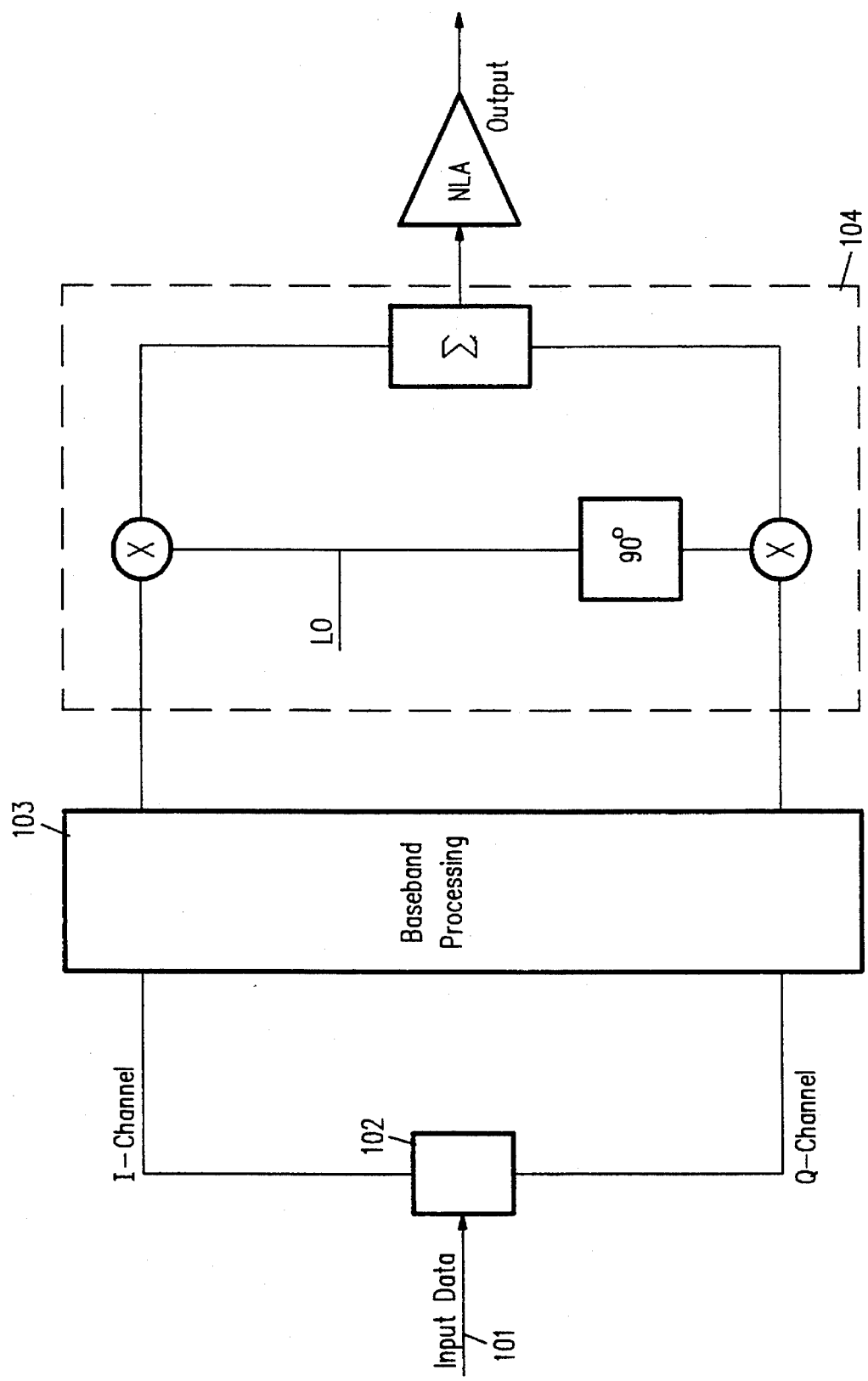
FIG. 3a is a diagram depicting one embodiment of the structure constructed in accordance with the teachings of this invention.
Figure 4:
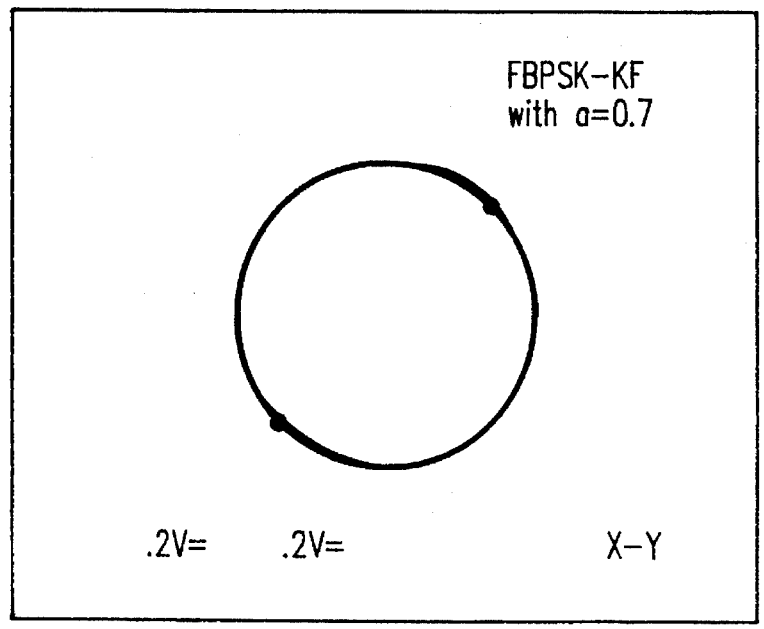
FIGS. 4 and 5 are constellation diagrams depicting the output signal obtained from one embodiment of this invention.
Figure 5:
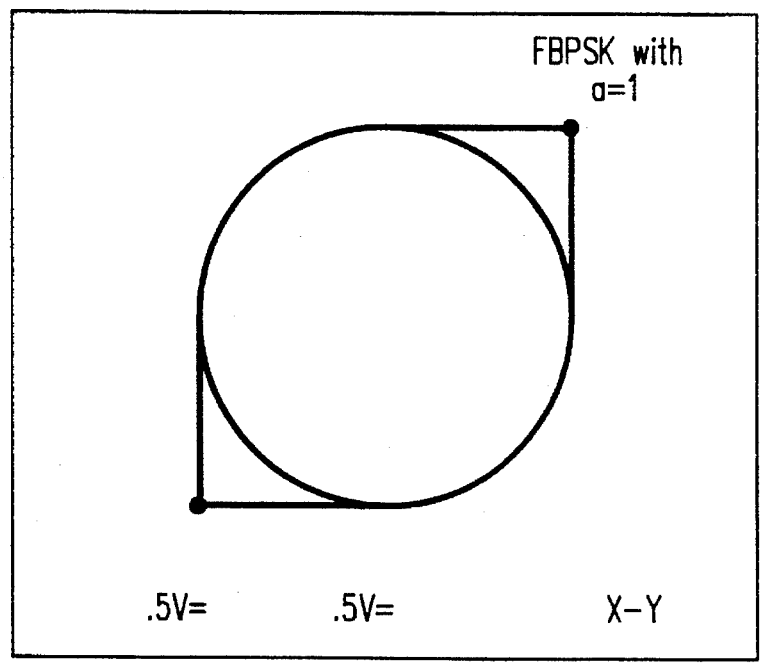
Figure 6A:
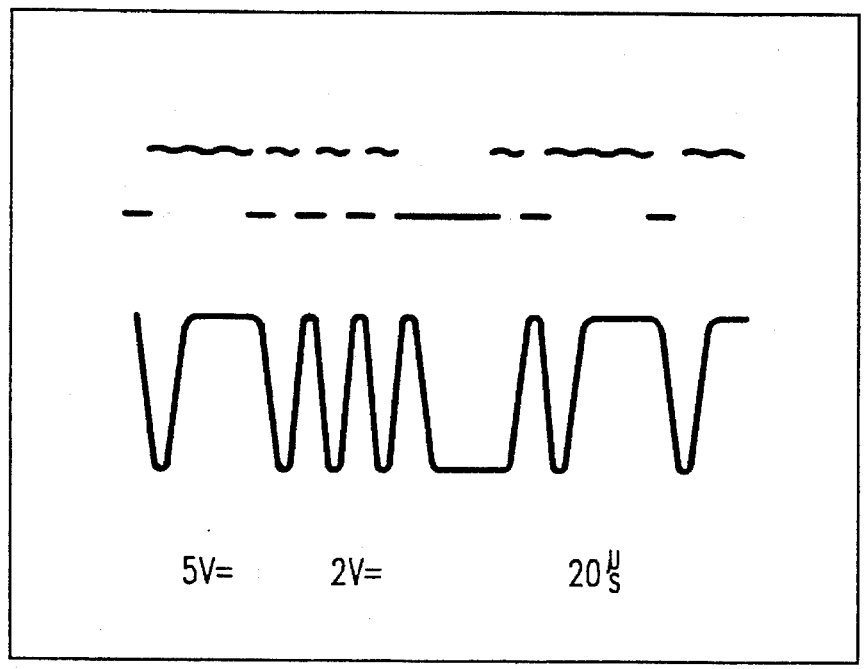
FIG. 6a depicts a NRZ data signal before and after input to the FBSK processor according to one embodiment of the present invention.
Figure 6B:
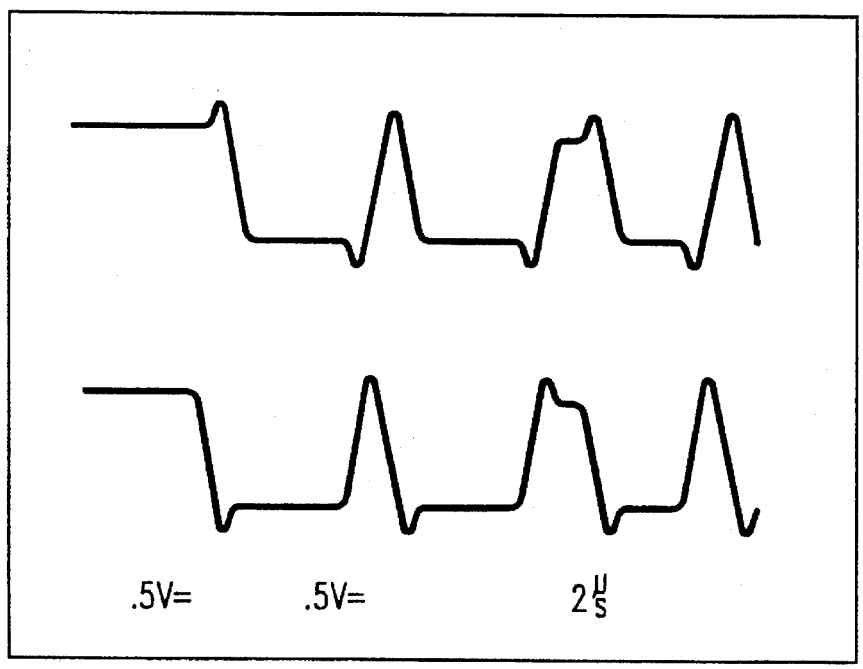
FIG. 6b illustrates the crosscoupled binary data fed into the I and Q quadrature modulators of the present invention.
Figure 7A:
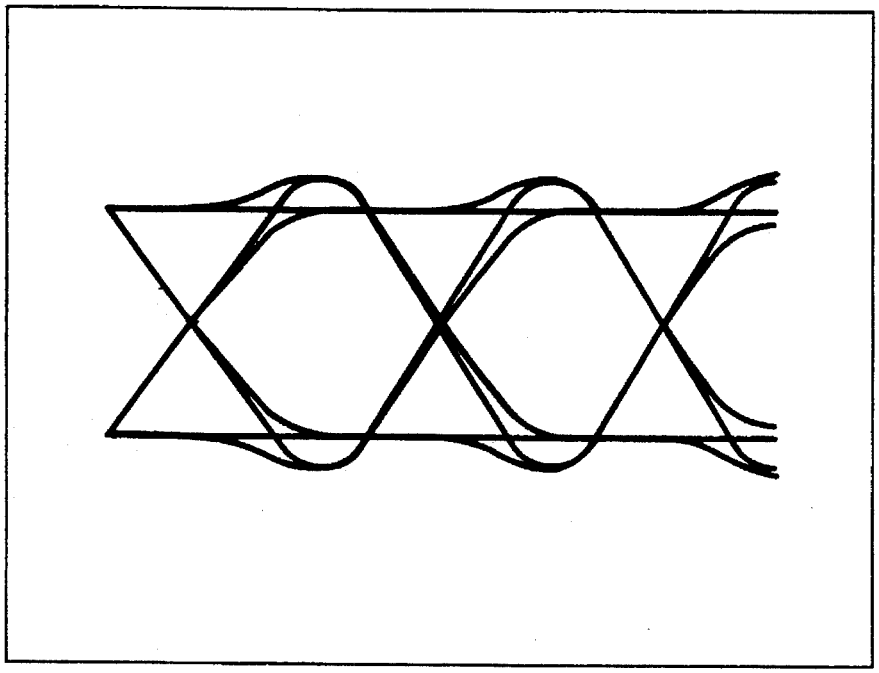
FIG. 7a is an eye diagram obtained from one embodiment of this invention.
Figure 7B:
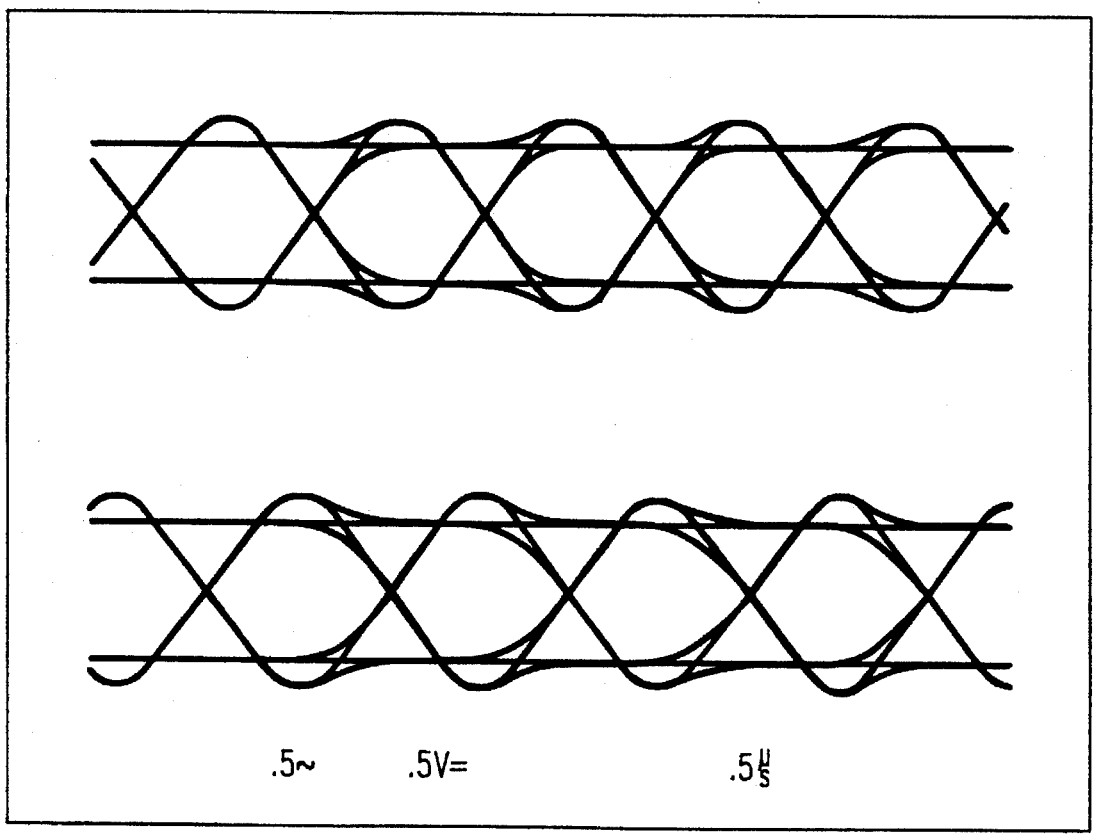
FIG. 7b are I and Q baseband eye diagrams obtained from one embodiment of this invention.

In this embodiment we refer to FIG. 3a in which an input binary data stream having an NRZ data format is received on lead 101 and split into the I and Q channels by splitter 102, and fed to baseband processing circuitry 103. Splitter 102 combined with baseband processors 103 provides crosscoupling and filtering between the I and Q channels. By this architecture and by connection of baseband processor 103 to quadrature modulator 104 a QPSK-like signal is attained, however the information content is that of BPSK. FIG. 4 and FIG. 5 show the "binary" constellation diagrams obtained by this configuration. FIG. 6a shows the NRZ datastream and FBPSK processed initial signal while FIG. 6b shows the crosscoupled binary data fed into the I and Q quadrature modulators. FIG. 7a illustrates the binary BPSK eye diagram obtained at the output of a conventional BPSK demodulator, and FIG. 7b depicts the in phase(I) and quadrature (Q) demodulated eye diagrams.

Figure 3B:
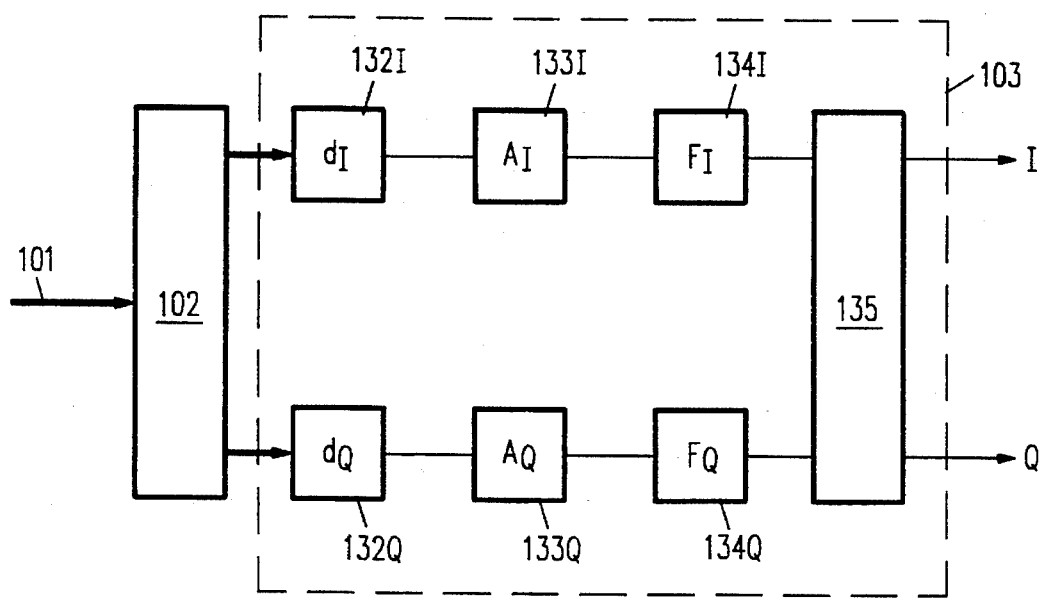

In one embodiment, as depicted in FIG. 3b, baseband processing circuitry 103 is shown with input signal splitter 102 (FIG. 3) and circuitry 103 includes, delay elements 132I and 132Q, amplifiers 133I and 133Q, and filters 134I and 134Q, as well as a second cross coupler 135. In the preferred embodiment, elements 102, 103 and 135 are symmetrical, but may be asymmetrical as required for a given application. In one embodiment, baseband processor 103 provides a delay of half a bit period in the Q channel and no delay in the I channel, that is $d_Q=T_b/2$, and the I channel and Q channel NRZ signals, which are identical to the input NRZ signal, are filtered by the same type of filters 134I and 134Q. In one embodiment, these filters are simple lowpass filters having a 3 dB attenuation frequency close to the Nyquist frequency. For an $f_b=1$ Mb/s example, the 3 dB attenuation of these filters is a variable typically between 100 kHz and 900 kHz, depending on particular system-spectral efficiency, degradation budget allowance, and power efficiency requirements. Thus the output signals of baseband processor 103 of FIG. 3a (the I and Q drive signals to quadrature modulator 104) are offset by a delay which could be, for example $d_2=0.5*T_b$. This setup is in appearance similar to conventional offset QPSK (OQPSK) with the important distinction being that in OQPSK the I channel and Q channel drive signals are independent (not correlated) bit streams obtained at the outputs of Parallel to Serial (P/S) converters while in the present invention the same input data is split (coupled) prior to any baseband processing to form the so-called I and Q channels of data. Thus, in accordance with this invention, the I and Q signals are crosscoupled. In contrast, a conventional BPSK modem uses only one channel for transmission, and has two signal states that are 180 degrees apart. Transitions between these states pass through zero amplitude, causing envelope fluctuations which results in spectral restoration or spectral regrowth.

The initial set of FBPSK results was generated using the embodiment of FIG. 3a, utilizing a very simple "splitter" or "crosscoupler" for the input signal implemented by means of coupler 102. This splitter provides the same signal into the I and Q channels. In the I channel, a $d_1=0$ second delay was used for delay element 132I, and a unity gain ($A_1=0$ dB) device, in its simplest form, a short circuit, was used for amplifier 133I. In this example, the I channel "$F_I$" and Q channel "$F_Q$" filters were one of the following:

a) a 4th order Butterworth filter with a variable 3 dB cutoff frequency b) Asymmetrical filters and amplifiers in the I and Q channels c) A Gaussian lowpass filter d) An Intersymbol-Interference Jitter Free Filter and Crosscorrelated filter such as described in U.S. Pat. No. 4,339,724 to Feher, also known as "FQPSK" and U.S. Pat. No. 4,567,602 to Kato et al., also known as the "FQPSK-KF" baseband and processor. A detailed technical description of related filter implementations is outside the scope of this discussion, but may be found in K. Feher, "Wireless Digital Communications: Modulation and Spread Spectrum Techniques", Prentice Hall, 1995 (available March 1995); and K. Feher, Ed., "Advanced Digital Communications", Prentice Hall, 1987.

In accordance with this invention, FBPSK modems which are BPSK compatible take advantage of the quadrature structure of QPSK and of OQPSK modems, and may take also advantage of the baseband processing of the FQPSK filter, which smooths the pulse transition, and eliminates the need for sharp raised cosine type of filtering as needed in normal BPSK modems. The "FQPSK" processor, the popular term for Feher's Filter U.S. Pat. No. 4,339,724, is a convenient simple implementation, however other non-patented filters could be also used in practicing the present invention. In FBPSK modems of this invention, the data in the I and Q channels are the same, the Q channel data are offset by one half bit (Tb/2). In an alternative embodiment, cross correlation between I and Q channels based on the FQPSK-KF processor (FQPSKKF is an abbreviation for the Kato/Feher U.S. Pat. No. 4,567,602 processor) additionally enhances the spectral properties when used in conjunction with the principles of this invention.

Figure 3C:
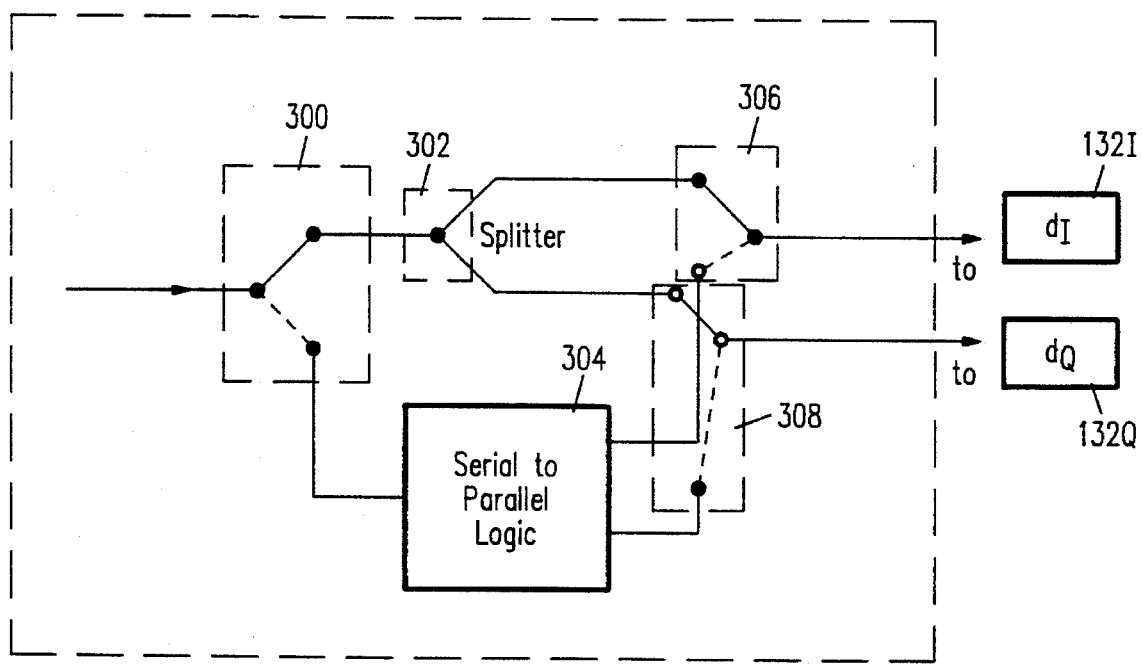

FIG. 3c is a diagram depicting one embodiment of splitter circuit 102 suitable for use as splitter 102 of FIGS. 3a and 3b. As shown in FIG. 3c, splitter 102 includes a first switch 300 which selects between a conventional splitter 302, and serial parallel logic 304. Switches 306 and 308 serve to connect the I and Q output channels (to processor 103) of splitter circuitry 102 to either splitter 302 or serial to parallel logic 304. Thus, when prior art QPSK modulation is to be performed, switches 1, 2, and 3 are set to allow input data received on input lead 101 to be fed to serial to parallel logic 304, which provides appropriate I and Q output signals. Conversely, when the same circuit of this invention is to perform FBPSK, switches 300, 306 and 308 are set to provide input data from input lead 101 to splitter 302, which provides the same data as I and Q channel data to baseband processing circuitry 103.

Figure 8:
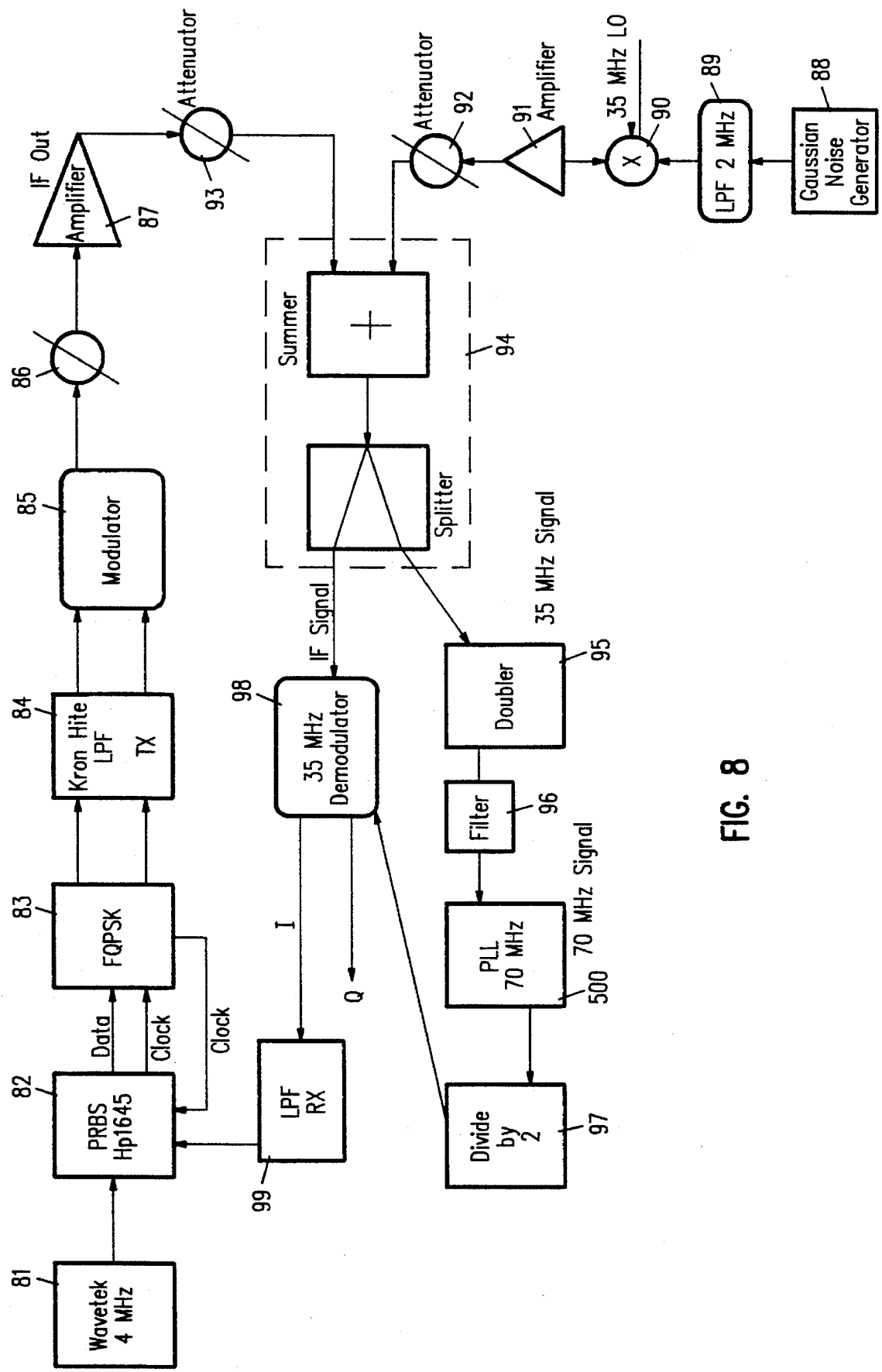
FIG. 8 is a block diagram of one embodiment of a FBPSK/BPSK modem and test set-up according to the teachings of this invention.

A block diagram of one embodiment of a FBPSK/BPSK modem setup of this invention is shown in FIG. 8, which is divided into different parts which are now described in detail.

FBPSK/BPSK transmitter

The modem baseband signal is generated using a FQPSK baseband processor, or another prior art processor. Signal generator 81, such as the Wavetek model 275, supplies a 4 MHz clock TTL signal to "CLOCKin" of the FQPSK baseband processor box 83, via the Pseudo Random Binary Signal (PRBS) generator 82. By way of example, box 83 has been designed using a XILINX FPGA chip which implements BPSK or FBPSK modulation. Other modulations can be implemented by only changing the EPROM in the box. Intel FPGA based baseband processors such as Intel 740 have also been designed to achieve such baseband processing. "CLOCKout" from FQPSK box 83 is then fed back to a Data Error Analyzer 82 (such as the Hewlett Packard PRBS generator and Error Analyzer model 1645), which is set to external clock, so that it is driven by the external clock signal from FQPSK box 83. "DATAout" from analyzer 82 is fed to "DATAin" of FQPSK box 83. Processor box 83 generates I and Q signals which contain the same data, but which are, in this example, offset with half a bit as explained earlier. The I and Q signals are fed to low pass filters 84, for example 4th order Butterworth filters (such as are available from Krohnhite), which have been set to about 600 kHz in this example, operated at an 1 Mb/s data rate. The output signals from lowpass filters 84 are first passed through two variable attenuators which are located between the low pass (Krohnhite) filters outputs and modulator quadrature inputs (not shown in FIG. 8. - however these variable attenuators can be, if desired, the same component type as attenuator 133I, having 1 db steps), to insure both signals have the appropriate levels for the modulator.

Adjustment of I and Q baseband signals

To optimize the transmitted I and Q baseband signals, the outputs of low pass filters 84 are displayed on an oscilloscope (such as are available, for example, from Tektronix or Hewlett Packard), which is triggered by the symbol clock coming out of baseband processor box 83. The baseband signals preferably have no DC level, and this is achieved by adjusting the DC level knob on the Krohnhite active adjustable low pass filters 84. For one application the I and Q signals should have the same amplitude level, which is achieved by using the variable attenuators. For other applications signal levels are not the same for the I and Q drives.

To further optimize the baseband signal, the oscilloscope is set to XY signal so the I signal is the abscissa, and the Q channel is the ordinate. The oscilloscope displays a full circle (i.e. constant envelope) for FBPSK with a crosscorrelator coefficient of a=0.7 as shown in FIG. 4, or a circularly shaped signal with two additional traces and shiny points. These additional traces resemble right angles with legs tangent to the circle. FIG. 5 illustrates measured FBPSK signals without additional crosscorrelation, i.e. a=1, based on the "FQPSK-KF" filter parameter. The I and Q baseband signals should not drive the mixer of the modulator 85 hard, since excessive drive by the baseband signals produces spectral restorations at IF or directly at RF.

Modulation is performed with modulator 85 multiplying the baseband I and Q signals with a carrier signal. In this example, a 35 MHz carrier signal is generated using a Fluke 6060B signal generator. The carrier signal level is set to approximately +7 to 8 dBm, with higher signal levels having been demonstrated to distort the spectrum at regeneration. The I and Q baseband signals are set to approximately 800 mVolts peak to peak at the input to the mixers of modulator 85.

Figure 9:
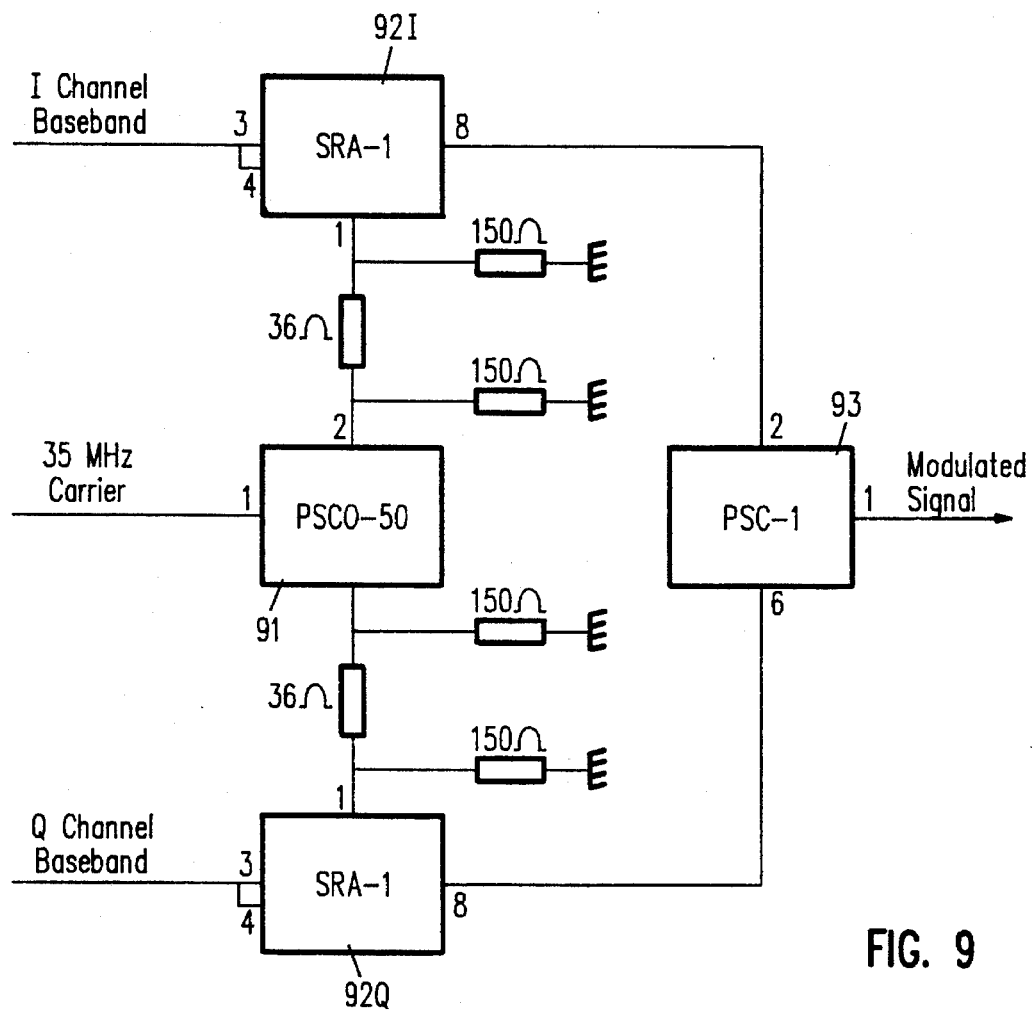
FIG. 9 is a diagram depicting one embodiment of a modulator suitable for use as modulator 85 of FIG. 8.

One embodiment of a modulator structure suitable for use as modulator 85 is shown in FIG. 9, where the 35 MHz carrier signal is fed to 90 degree phase splitter 91; this results in two 35 MHz signals which are in quadrature and used to modulate the I and Q channels utilizing mixers 92I and 92Q. The modulated signals are then added by adder/splitter 93 to produce the 35 MHz modulated IF signal. By way of example, the components used to design the modulator are based on the following Minicircuit components: SRA-1 mixers, PSCQ-50 90 degree phase splitter at 35 MHz, and PSC-1 adders.

Referring again to FIG. 8 the modulator signal output is passed through attenuator 86 (such as a Wavetek model 7535 with 5 dB steps), to change the input signal level applied to IF amplifier 87 to insure proper operation in either the linear or the nonlinear mode. In one embodiment, amplification of the combined I and Q channels is achieved using two cascaded amplifiers forming amplifier 87, such as models ZHL-3A available from Minicircuits. Two cascaded amplifiers of the gain provided by model ZHL-3A are used in each channel to provide the required gain needed to achieve saturation mode operation.

Figure 1:
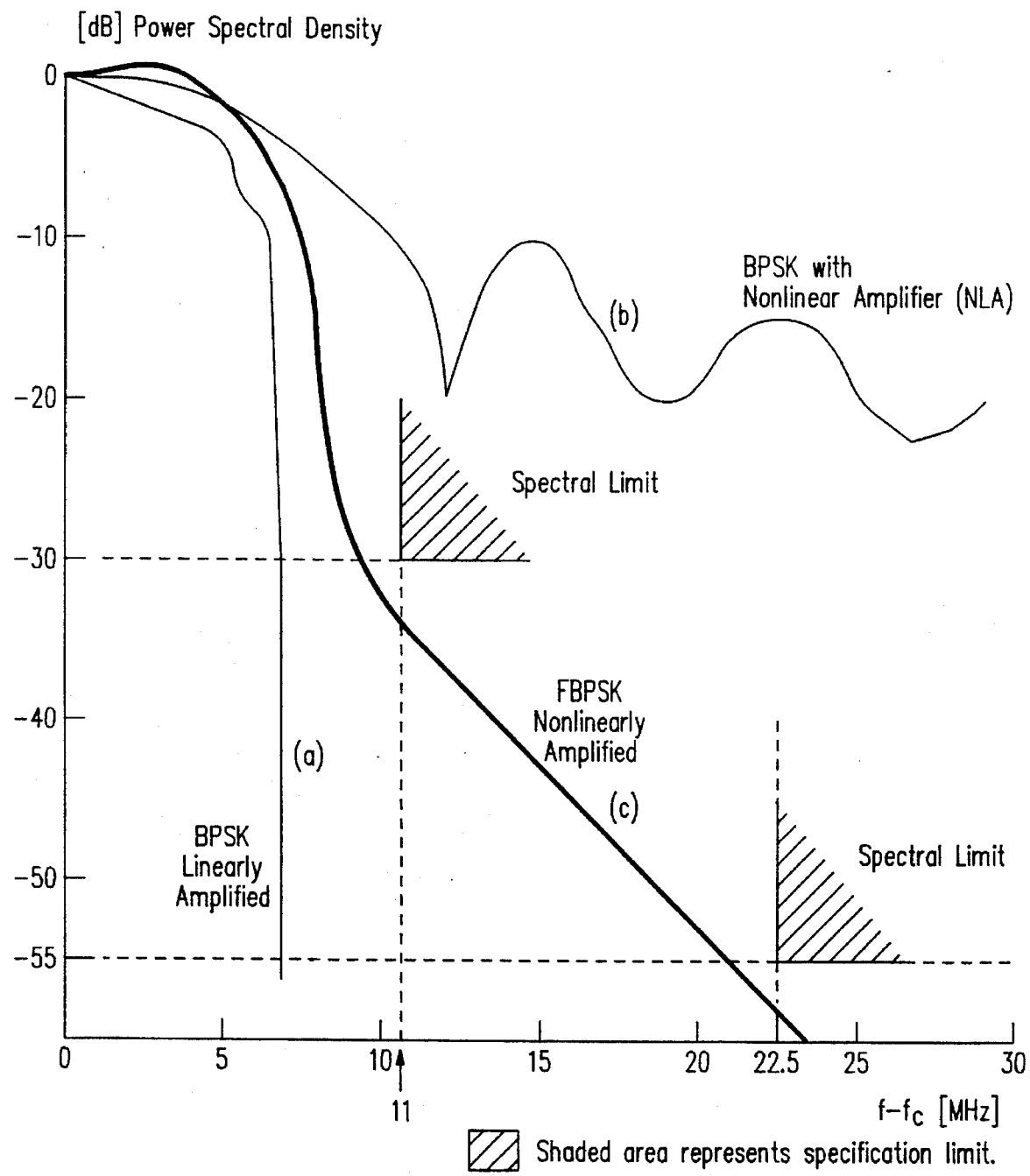
FIG. 1 is a graph depicting computer simulated power spectral density of bandlimited BPSK linearly amplified, BPSK nonlinearly amplified, and the novel FBPSK nonlinearly amplified signal of this invention, together with an indication of the spectral efficiency requirements of the IEEE 802.11 standard.
Figure 2A:
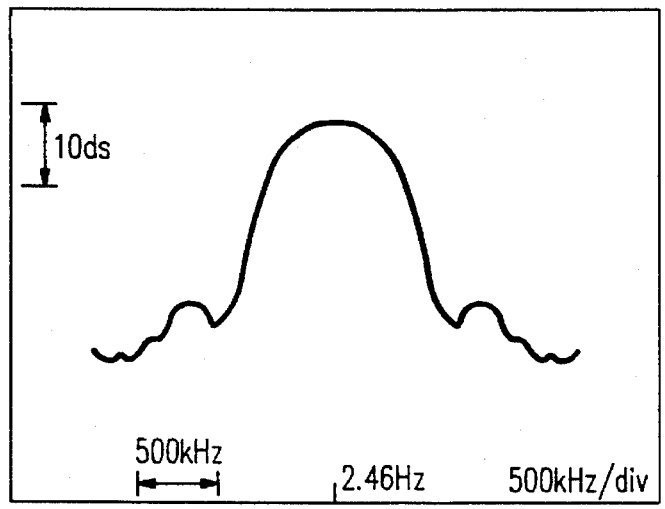
FIG. 2a depicts linearly amplified DBPSK modulation of the prior art utilizing 5 dB OBO.
Figure 2B:
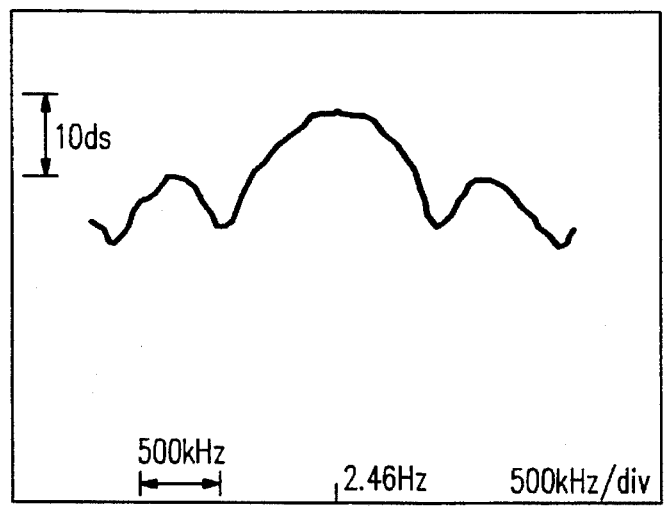
FIG. 2b depicts an output signal of prior art nonlinearly amplified DBPSK.
Figure 2C:
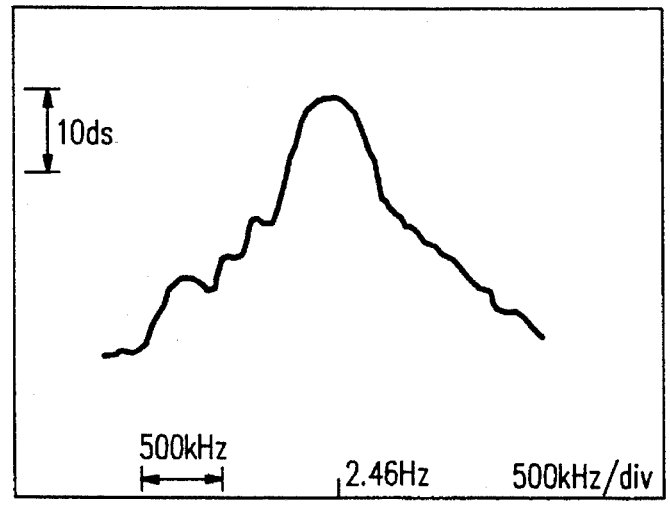
FIG. 2c depicts an FBPSK modulated nonlinearly amplified signal with 0 dB OBO in accordance with one embodiment of this invention.

Spectral efficiency and power efficiency are major factors when designing any communication system. Wireless systems must consume less power for longer operation than many other types of systems. To achieve multiple access, such as time division multiple access (TDMA), carrier division multiple access (CDMA), and frequency domain multiple access (FDMA), spectral use of a single user should be held to a minimum occupancy. A trade off must be made when choosing a modulation technique for its spectral or power efficiency. BPSK is a good modulation technique for use in linear channels, and where spectrum is not very critical. In Wireless LAN, BPSK has been chosen as the standard modulation for direct sequence spread spectrum (DSSS). This modulation technique is good but suffers much from power deficiency. To achieve the −30 dB power spectral density attenuation requirement, specified by IEEE 802.11, (refer again to FIG. 1), BPSK must operate in a linear mode which has been shown to have poor power efficiency when compared to the FBPSK modulation technique of the present invention.

In one embodiment, spectrum measurement was performed using the following procedures: The output of IF amplifier 87 of FIG. 8 is fed directly to a spectrum analyzer.

Figure 10:
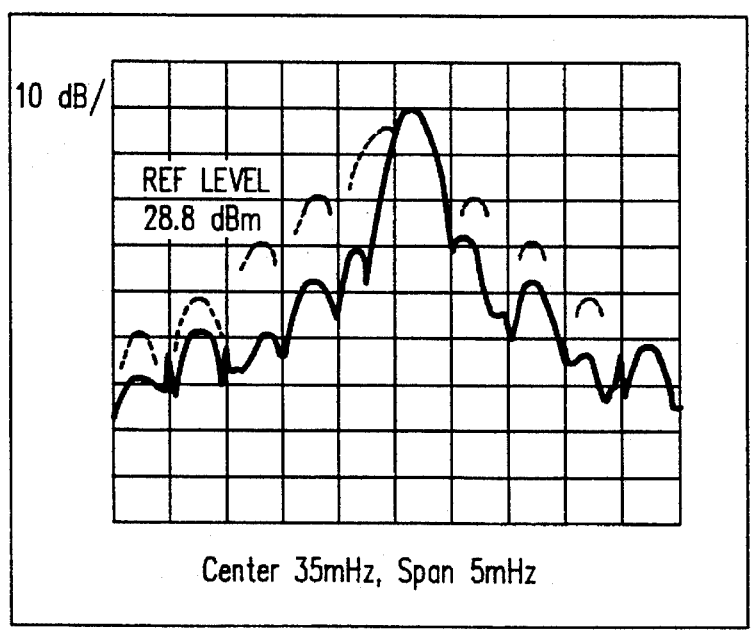
FIG. 10 is a graph displaying the FPBSK and BPSK output spectra of the embodiment of FIG. 8.

The analyzer is adjusted in terms of resolution bandwidth, sweep time, and video bandwidth. To have the system in nonlinear mode, attenuator 86 preceding IF amplifier 87 is adjusted until changes in the attenuator 86 have no effect on the main lobe magnitude. The effect of the local oscillator (LO) level on the IF spectrum is seen by changing the amplitude of the local oscillator applied to modulator 85. The baseband filtering also has its effect on the spectrum, with filtering of one channel more than the other having an impact on the spectrum shape. To demonstrate the conventional BPSK spectrum and spectral regrowth, simply remove one channel (I or Q) and monitor the spectrum. The spectrum of both FBPSK and BPSK are shown in FIG. 10. For conventional filtered, nonlinearly amplified BPSK, the spectrum in the nonlinear mode was found to have approximately the same shape as the modulated, unfiltered NRZ spectrum, where the second lobe amplitude level is about 14 dB below the main lobe (see the upper trace of FIG. 10). If this is not the case in the experiment, then the IF signal is not fully saturated and the attenuation provided by attenuator 86 must be reduced to provide a higher signal to IF amplifier 87 in order to operate in a fully saturated nonlinear mode.

Referring again to FIG. 8, Gaussian Noise (AWGN) is generated using noise generator 88, such as model 603A from Elgenco Co. The output of the noise generator is fed to low pass filter 89 (such as Allen Avionics model F3568). By way of example, the filter has a cutoff frequency $F_c$ at 2 MHz and 75 ohms of input/output impedance. The filter output is fed to mixer 90, which also receives the IF LO signal. In this example, the LO mixer input is a 5 dBm signal of 35 MHz. The RF output of the mixer is then fed to amplifier 91 (such as Minicircuit model ZFL-1000VH). The output of amplifier 91 is fed to variable attenuator 92 (such as Wavetek model 7580A), and the output of attenuator 92 is added to the IF modulated signal from attenuator 93 using any conventional passive or active adder/splitter device 94, in order to provide a combined IF signal and IF band limited noise.

Figure 11:
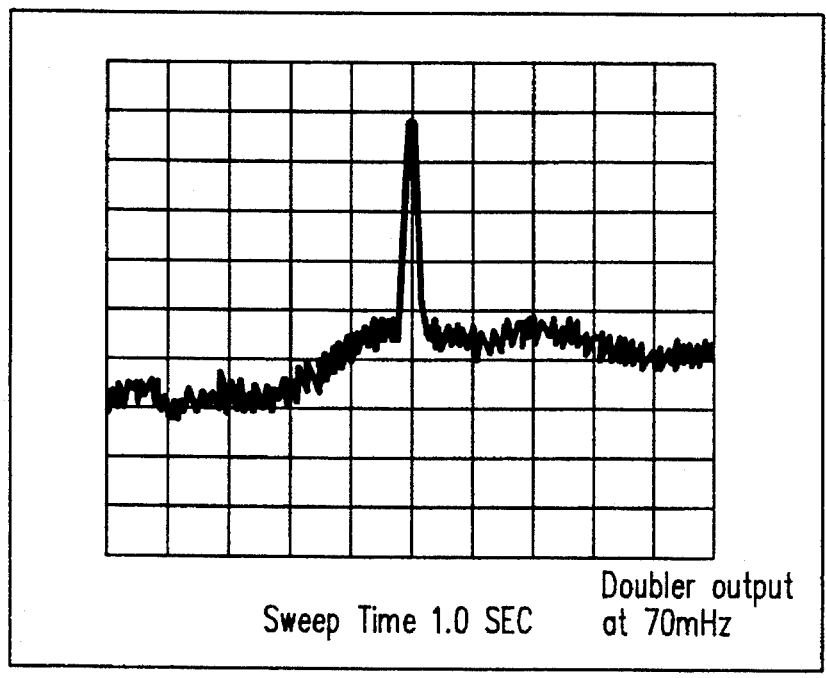
FIG. 11 is a graph depicting the 70 MHz spectral component provided by frequency doubler 95 of FIG. 8.

The FBPSK IF signal at the receiver may be coherently or noncoherently demodulated. For the purposes of this discussion a conventional BPSK demodulator is used. With coherent demodulation, the basic idea is to square the IF signal in order to generate spectral components at 70 MHz (see FIG. 11). This is achieved because of the nonlinearity of multiplier 95 used for doubling the IF signal. The doubled signal is then filtered with 70 MHz bandpass filter 96, recovered by the Phase Locked Loop (PLL) 500 and then divided by two by divider 97 to develop the 35 MHz signal to be used for demodulation by demodulator 98. The PLL subsystem for carrier recovery is described in the following paragraphs.

PLL set up and Design

Figure 13:
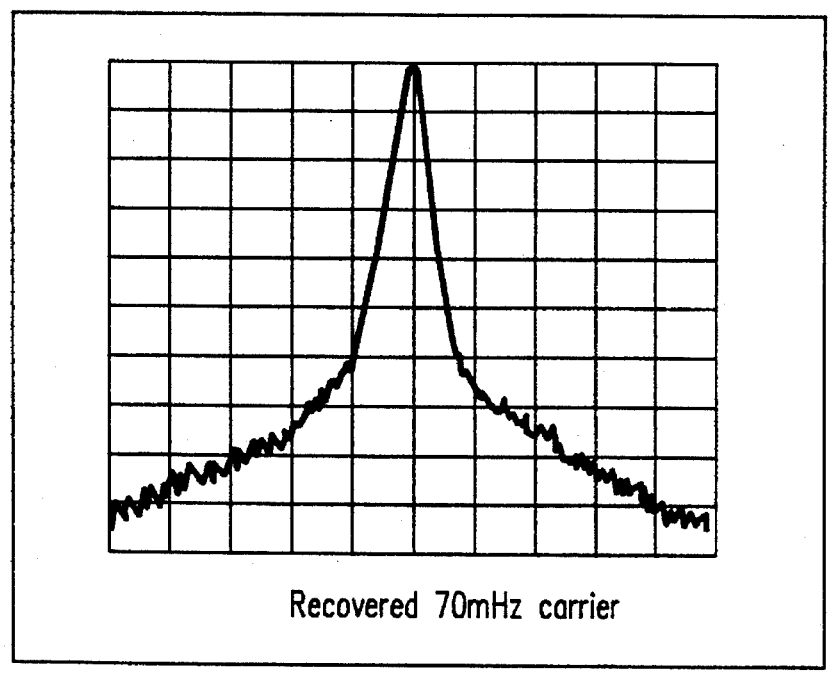
FIG. 13 is a graph depicting the recovered 70 MHz carrier signal available as an output from PLL 96 of FIG. 8.
Figure 12:
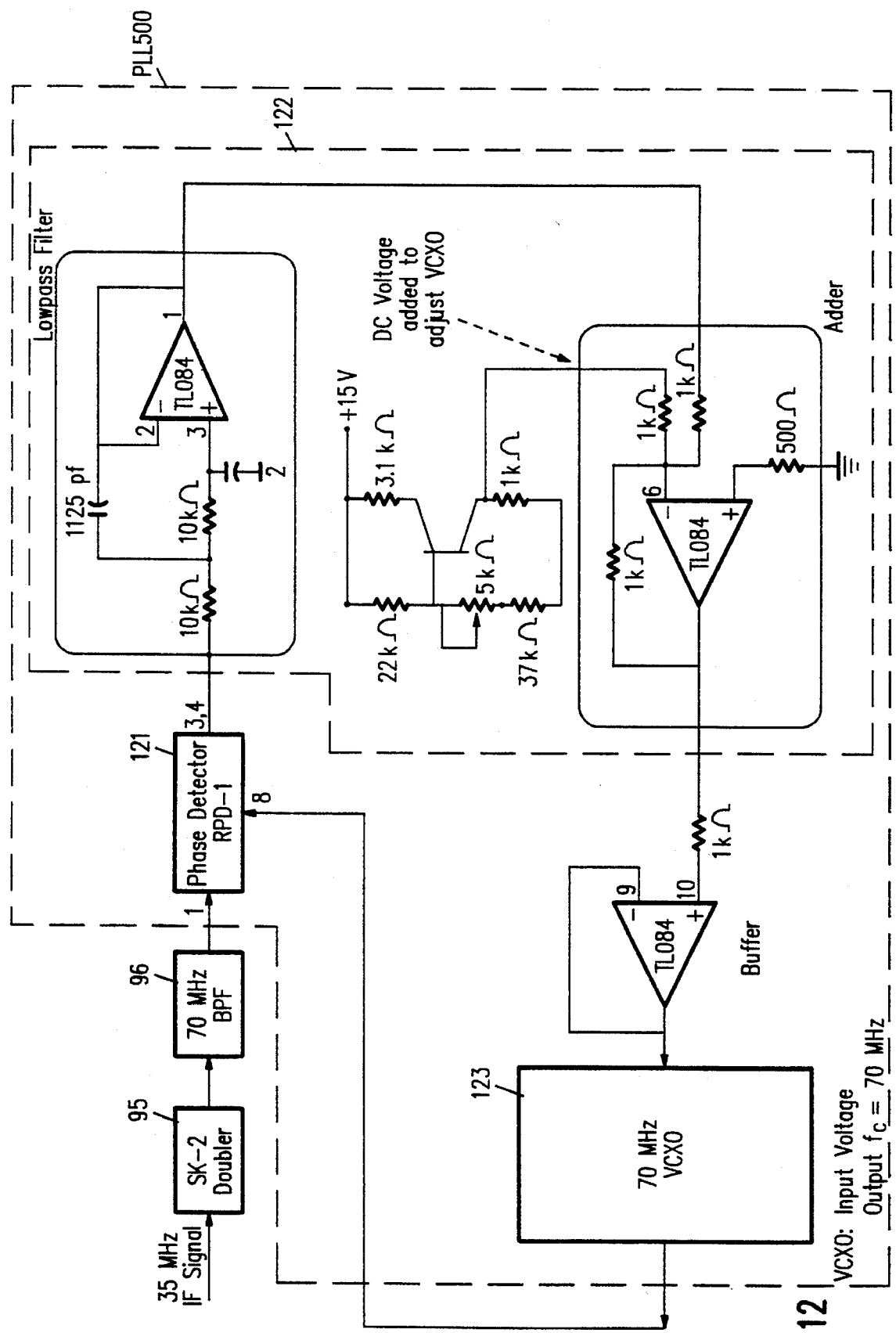
FIG. 12 is a block diagram depicting one embodiment of a PLL suitable for use as PLL 96 of FIG. 8.
Figure 14:
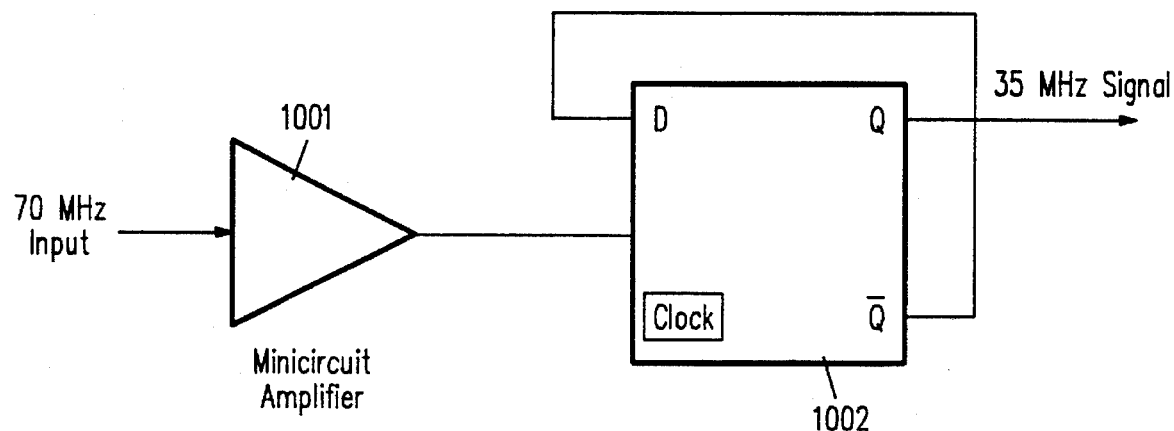
FIG. 14 is a diagram depicting one embodiment of a divide by two circuit suitable for use as divided by two circuit 97 of FIG. 8.

The IF signal that resulted from the addition of the noise signal (from attenuator 92) and IF modulated signal (from attenuator 93) is split into two IF signals by summer/splitter 94. The first IF signal is fed to doubler 95 (such as Minicircuit model SK-2), with the doubler output being fed to a filter 96 then to a 70 MHz Phase lock loop 500. One embodiment of PLL 500 is shown in the schematic diagram of FIG. 12. It consists of phase detector 121, loop detector 122 and VCXO oscillator 123. The output of the doubler 95 is filtered by a 70 MHz low pass filter prior to input to the PLL 500. The PLL output (see FIG. 13) is another 70 MHz signal which is fed to the divide by two circuit 97 (FIG. 8). As shown in FIG. 14, one embodiment of a divide by two circuit suitable for use as divide by two circuit 97 of FIG. 8 includes amplifier 1001 used to saturate the input signal to create an almost square signal, and flip flop 1002 which divides the carrier frequency by two to provide a 35 MHz output signal.

The PLL lock range can be tested by changing the 35 MHz carrier signal of the Fluke, and attempting to lock to the new modulated signal. Locking can be checked by looking at the PLL VCXO signal or by monitoring the received eye diagram. The pull range is measured by varying the transmitted carrier until the PLL looses lock. The phase jitter of the recovered carrier can be monitored by looking at the VCXO signal on the spectrum analyzer.

Demodulator at 35 MHz

Figure 15:
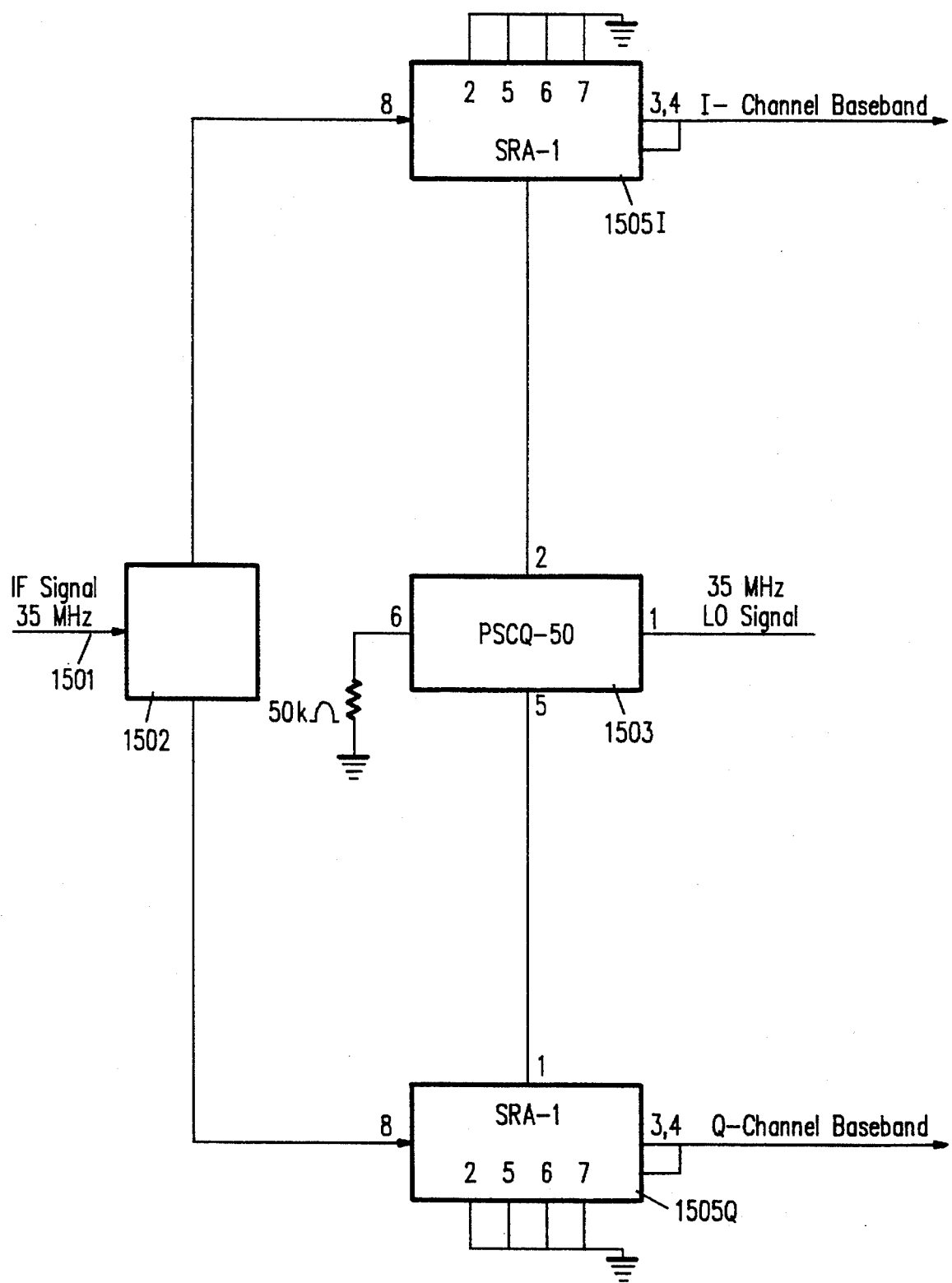
FIG. 15 is a diagram depicting one embodiment of a 35 MHz demodulator suitable for use as demodulator 98 of FIG. 8.

FIG. 15 is a schematic diagram depicting one embodiment of a demodulator suitable for use as demodulator 98 of FIG. 8. The IF signal received on lead 1501 is first applied to splitter 1502 and thus split into two IF signals with zero phase difference. A 35 MHz LO carrier signal is fed to a 90 degree phase splitter 1503 (such as model PSCQ-50 available from Minicircuits) to generate the appropriate carrier signals to demodulate the IF signal. The two IF signals are then fed to mixers 1505I and 1505Q, respectively, which demodulate the IF signals to produce the I and Q baseband signals. The I and Q -baseband signals are then fed to low pass filter 99 of FIG. 8 (such as a Kronhite filter). In the FBPSK case, we are concerned with the I channel as the main signal of concern. For other applications, a combination/processing of both I and Q channels is used. The receive low pass filter is critical to system performance, with wider filter characteristics allowing more noise to enter the system, and thus degrade performance. In our measurements, we used the Krohnhite filter which is a 4th order Butterworth filter and roll off that is not very sharp. The optimum receive filter bandwidth for this experiment has been found to be around 0.6 * fb (fb is the bit rate), or 300 kHz for a 500 kb/Sec bit rate. Preferably the received eye diagram has no DC components, which can be removed by adjusting the Krohnhite filter's "DC knob".

To adjust the quadrature setting eliminate the I baseband signal and monitor the received I channel. In this setup we use linear amplifiers, so ideally, there should be no signal. Any signal in the I channel is proof of the imperfection of the quadrature between the I and Q in either the transmit or receive side. Impedance mismatch and inappropriate signal levels which drive the mixers add to this phenomena of leakage between both channels. The same test can be performed on the Q side.

In one of the test setups, we used a "hard-wired" clock recovery circuit. The receive clock is taken from the transmitter clock using a T connector. The received baseband signal which can be monitored on a scope with triggering from the symbol clock is fed to the threshold detector which has three inputs: Symbol Clock, Signal In from the receive filter, and Signal Out going to the HP 1645 analyzer.

Figure 16:
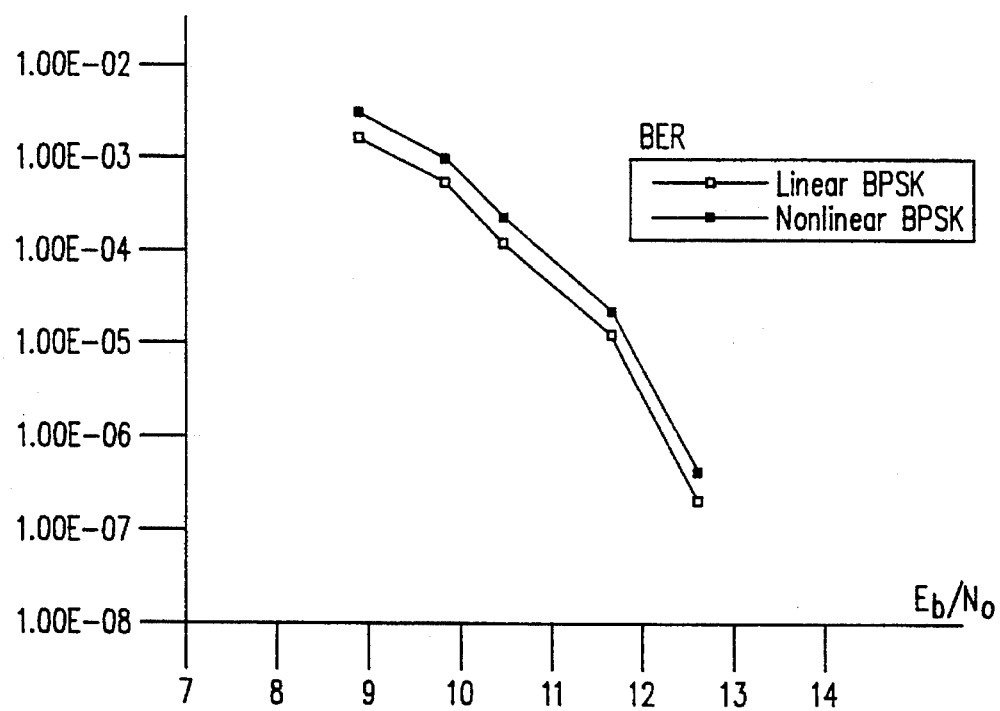
FIG. 16 is a graph depicting the BER performance of linear and nonlinear BPSK modulation utilizing the embodiment of FIG. 8.

To measure the performance of this modem, transmit data should be compared with receive data. In the above set up, the transmitted data is "DATAout", the receive data is "DATAin". The threshold detector output is fed to "DATAin" of the HP1645 data error analyzer. The measured bit error rate (BER) is displayed on the H1645. To compare the BER performance of BPSK/FBPSK in both linear and nonlinear channels, the above procedure was performed and the compiled data is shown in FIG. 16.

FBPSK/BPSK modems have been experimentally tested for their spectrum and power efficiency. The experimental hardware setup procedure and the technique to optimize the system performance is described. The BER performance in both linear and nonlinear channels is presented. FBPSK modems have been shown to outperform BPSK modems in spectral efficiency, and power efficiency. Our experimental nonlinearly amplified FBPSK modems achieved a BER of $10^{-4}$ for $E_b/N_o$ of 11.8 dB which is about 0.9 dB worse than measured BPSK linearly operated modems. Computer simulations with improved hardware models indicate BER of $10^{-4}$ for 22 dB of $E_b/N_o$. Other factors that have degraded our FBPSK/BPSK measurement compared to theory are: component imperfections, cable mismatch (50 and 75 ohms), and impedance mismatch between system components.

Figure 17:
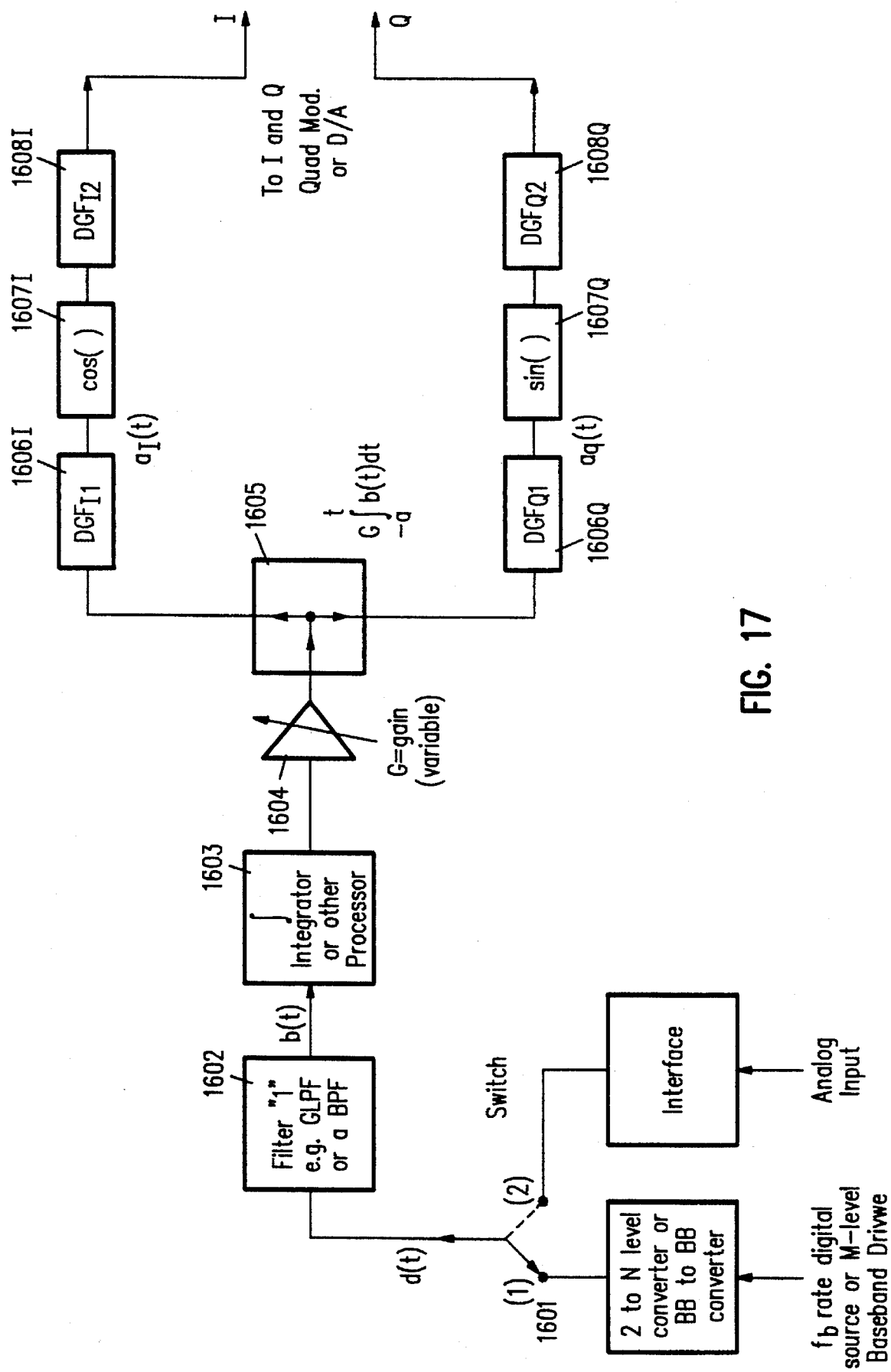
FIG. 17 is a diagram depicting one embodiment of this invention suitable for use in analog or digital FM, phase modulation (PM or PSK) and QAM quadrature cross-correlated modulation utilizing either linear or nonlinear amplification.

In FIG. 17 one embodiment of this invention suitable for use in FM and QAM quadrature crosscorrelated modulation and amplification (linear or nonlinear) is illustrated. Quadrature Crosscoupled Frequency Modulation (FM) or for short Feher's FM ("FFM") and Feher's Crosscoupled QAM ("FQAM") applications are illustrated. The in phase (I) and Quadrature (Q) baseband output signals may be used to drive the I and Q inputs of a quadrature modulator or fed to oversampled D/A devices which provide an alternative for I-Q modulation.

In Gaussian FSK (GFSK) the modulation index is variable, while in GMSK it is 0.5 exactly. The embodiment of FIG. 17 teaches a new, efficient and highly accurate method and structure suitable for use in recently standardized wireless systems such as Gaussian Low Pass Filtered (GLPF) digital FM (known as GFSK) of four level FM ("FFM") and of other binary and of multilevel FM including partial response digital FM and of analog FM systems. We will call this embodiment Fehers Frequency Quadrature Correlated Modulation or for short FFM.

As shown in FIG. 17, the input signal can be either digital or analog, with input selector switch 1601 selecting either the binary or multilevel digital input signal or the analog input signal. Alternatively the analog and digital signals are combined into one or more "hybrid signals" (combined analog and digital signal). Input filter 1602 is, for example, a Gaussian Shaped Lowpass Filter (GLPF), a Butterworth filter or any other filter/processor including but not limited to Bandpass, Highpass, and Lowpass filters or nonlinear filters and limiters. Integrator 1603 is, for example, a mathematically almost ideal integrator implementation or any other signal processing shaping function, such as a squaring device, cubic device, differentiator or logic processor. Gain block 1604, which is a conventional amplifier or attenuator, performs gain adjustment. The value of gain G can be either less than unity (attenuator) or greater than or equal to unity (amplifier), depending on the particular application. In case of FM applications, this G gain is related to the FM modulation index.

The crosscorrelation of the I and Q channels is achieved by splitting device 1605, whereby the same input signal is split into the I and Q channel signals. Splitter 1605 is, for example, a passive or active coupler (splitter) which provides two equal or unequal signals, with differently attenuated values in the I and Q channels. Delay, gain, and filter (DGF) elements 1606I and 1606Q need not be identical for both the I and Q channels. If desired for specific system requirements, DGF elements 1606I and 1606Q introduce further crosscorrelation properties between the I and Q channels, for example by reducing or increasing the correlation value over a segment of time (zero to many bits) of the I and Q correlated signals. For example, for an increased value of the I signal the Q signal could be reduced. Elements 1607I and 1608Q provide cosine and sin values of their respective inputs and are implemented, for example, by digital signal processors or other well known methods. However other mathematical functions and their implementations are also suitable for use as elements 1607I and 1607Q of this embodiment. For example, truncated and peak value limited cosine and sin values shifted or raised cosine/sine, partial parabolic, cubic and amplitude limited functions, and their approximations, are suitable. For the sin and cosine functions, ROM and FPGA devices serving as look up tables are conveniently implemented. Additionally, a $\pi/4$ shifting (45°) or other logic encoding may be included.

The following is an illustrative example of the QUAD correlated implementation of GFSK and of 4-FM digital systems. Delay, gain and Filter (DGF) elements 1608I and 1608Q serve to further modify the crosscorrelation of the I and Q baseband signals. For example, depending on present and past bits as well as predicted future bits of the I channel the sample values of the Q channel can be modified. An application of these systems is, for example, in IEEE 802.11 standardized (during 1994 draft standard) WLAN applications in which the modulation index of digital FM and particularly of Gaussian FSK (GFSK) and 4-level FM must be less than m=0.5 in order to meet FCC spectral requirements. In this example, GMSK with M=0.5 is not suitable.

To elaborate and explain further our crosscoupled FM part of the invention we start with the conventional FM VCO (Voltage Controlled Oscillator) or traditional FM implementation of GFSK systems, equation (1). By expanding this equation into its quadrature terms we obtain a mathematically very simple Quadrature equation, equation (2) which is equivalent to the classical FM or GFSK system.

The conventional GFSK FM-VCO based implementation is:

$$v(t) = A \left[ \cos w_c t + G^* \int_{\infty}^{t} b(t)dt \right] \quad (1)$$

while the mathematical equivalent QUAD implementation is:

$$v(t) = A \left[ \cos w_c t \cos \left[ G^* \int_{\infty}^{t} b(t)dt \right] - \sin w_c t \sin \left[ G^* \int_{\infty}^{t} b(t)dt \right] \right] \quad (2)$$

The integral of the $a_i t$ and $a_q(t)$ functions are not necessarily of sinusoidal or cosine shape. In fact in many applications these integrated signals are random like digital or analog signals which do not even resemble sinusoidal waves.

Original elements of this invention include methods and structures for implementing the crosscorrelated or "coupled" QUAD equation of GFSK, 4-FSK and other I and Q crosscorrelated systems. While equation (2) is simple it should not be interpreted as a conventional QUAD modulator such as used in well documented QPSK, MSK, QAM, and offset or staggered QPSK (OQPSK) systems in which the I and Q channels are not crosscorrelated, and in fact where they are designed to be independent. Reference K. Feher, "Digital Communications: Satellite Earth Station Engineering, Prentice Hall, 1983. In conventional QPSK and QAM systems, instead of a splitter (such as splitter 1605 of FIG. 17) which splits the same signal into I and Q channels, a serial to Parallel logic converter is used which shifts alternate independent (not crosscorrelated bits or symbols) into the I and Q channels. As described previously with respect to FIG. 3c, the teachings of this invention can be used to provide a method and structure which is capable of serving a dual purpose, i.e. both conventional prior art QPSK (using a serial to parallel converter to derive the I and Q baseband information) and FBPSK of this invention, in which the I and Q baseband information is correlated by simply being split from the signal input data source and switched mode conventional QPSK and FBPSK.

Variable gain element 1604 of FIG. 17 is an essential and also new unit for binary FM, e.g. GFSK, 4-FM digital and other multilevel and analog quad implementations. This unit is not included in Gaussian Minimum Shift Keying (GMSK) in which the digital FM modulation index must be exactly m=0.50000. The fundamental difference between GFSK and GMSK is in the variable modulation index. The only known way in the prior art to reduce the modulation index is by a FM-VCO implementation model, i.e. the implementation of equation (1) and by reducing "G" in equation (1). While mathematically an extension to equation (2) is straight forward, the implementation of QUADcross correlative based FM systems is unobvious. We used here a mathematical simple concept to realize a practical implementable FM system with precisely controllable and arbitrary modulation index). DGF elements 1606I and 1606Q in FIG. 16 are not required for GFSK, however could be used for mixed AM QAM and FM implementations which may have constant or non-constant quadrature modulated envelopes.

This embodiment of the present invention, as described above for GFSK, based on FIG. 17 has been tested by us also for other systems, such as 3 level, 5 level partial response or correlative coded, and 4 level FM systems including coherent and noncoherent (differential and discriminator detection). Experiments on a similar implementation of elements 1606I and 1606Q (FBPSK) was constructed and tested over 2.4 GHZ microwave integrated amplifiers in a QUAD correlated transmit/receive configurations, as illustrated in FIGS. 2 to 17.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A structure comprising:

a input port for receiving input data;

a splitter having an input coupled to said input port, and serving to split said input data into baseband signal streams; and a baseband signal processing network for receiving said baseband signal streams and providing cross-correlated processed in phase and quadrature phase baseband signals.

2. A structure as in claim 1 which further comprises a quadrature modulator for receiving said processed in phase and quadrature phase baseband signals and providing a quadrature modulated output signal.

3. A structure as in claim 1 wherein said baseband processing network comprises for each of an I and Q channel:

an input port for receiving one of said baseband signal streams from said splitter;

a delay element coupled to said input port for delaying said one of said baseband signal streams a predefined period of time greater than or equal to zero and producing a delayed baseband signal;

an amplifier coupled to receive said delayed baseband signal and adjust its gain to provide a gain adjusted baseband data signal; and a filter coupled to receive said gain adjusted baseband data signal and provide a filtered baseband data signal for output to a quadrature modulator.

4. The structure as in claim 3 wherein said baseband processing network further comprises a cross-coupler for receiving said filtered baseband data signal and providing in response thereto a cross-correlated data output signal for each of said I and Q channels.

5. The structure as in claim 1 wherein said input data comprises an input signal selected from the group consisting of binary, multilevel filtered, multilevel unfiltered and analog signals.

6. The structure as in claim 3 wherein said delay provided in said one of said I and Q channels is greater than the delay provided in the other of said I and Q channels.

7. The structure as in claim 3 wherein said delay provided in said one of said I and Q channels is half a bit period greater than the delay provided in the other of said I and Q channels.

8. The structure as in claim 1 wherein said processed in phase and quadrature phase baseband signals have amplitudes such that their vector sum is substantially constant and has reduced resultant quadrature modulated envelope fluctuations.

9. The structure as in claim 1 which further comprises means for selectively reducing the cross-correlating factor down to zero.

10. The structure as in claim 2 which further comprises an amplifier operated in linear mode for amplifying said quadrature modulated signal and providing a linearly amplified output signal that is band limited.

11. A cross correlated quadrature architecture signal processor for producing cross correlated in phase and quadrature phase signal streams for modulation by a Quadrature Modulator comprising:

a filter for receiving an input signal selected from the group of binary, multi-level, and analog signals and combinations thereof and producing a filtered input signal;

signal shaping means for integrating said filtered input signal; , an amplifier for varying the modulation index of said signal processor, said amplifier receiving said filtered input signal and providing an amplified input signal;

a splitter receiving said amplified input signal and providing cross correlated data streams; and a signal processor having an in phase and quadrature phase channel each receiving one of said cross correlated data streams, each of said in phase and quadrature phase channel having a first delay gain filter, means for generating Cosine and Sine values for said in phase and quadrature phase channel datastream, a wave shaper and a second delay gain filter, such that said signal processor provides in phase and quadrature phase cross correlated data signals for quadrature modulation with a modulated signal adaptable for coherent demodulation of the quadrature frequency modulated (FM) signal.

12. A cross correlated quadrature architecture signal processor for producing cross correlated in phase and quadrature phase data streams for modulation by a Quadrature Modulator and subsequent coherent quadrature demodulation of the quadrature FM modulated signal comprising:

a splitter for receiving an input signal selected from the group of binary, multi-level, and analog signals and combinations thereof and providing a pair of identical data signals; and a signal processor including an in phase and quadrature phase channel each receiving one of said pair of identical data signals, each of said channels including a delay element for receiving said one of said pair of identical data signals and producing a delayed signal;

an amplifier for receiving said delayed signal and producing an amplified data signal;

a filter for receiving said amplified signal and producing a filtered data signal; and a function generator for generating Cosine and Sine values for said filtered data signal;

such that said signal processor provides in phase and quadrature phase cross correlated data signals for quadrature modulation with a modulated signal adaptable for coherent demodulation of the quadrature FM signal.

13. A cross correlated quadrature architecture signal processor for producing cross correlated in phase and quadrature phase data streams for modulation by a Quadrature Modulator and subsequent demodulation of the quadrature modulated signal comprising:

a splitter for receiving an input signal selected from the group of binary, multi-level, and analog signals and combinations thereof and providing a pair of identical signals; and a signal processor including an in phase and quadrature phase channel each receiving one of said pair of identical signals, each of said channels including a delay element for receiving said one of said pair of identical signals and producing a delayed signal;

an amplifier for receiving said delayed signal and producing an amplified signal;

a filter for receiving said amplified signal and producing a filtered signal;

such that said signal processor provides in phase and quadrature phase cross correlated signals for quadrature modulation with a modulated signal suitable for amplification in linear and non-linear mode adaptable for coherent and noncoherent demodulation.

14. A cross correlated quadrature architecture signal processor for producing cross correlated in phase and quadrature phase data streams for modulation by a Quadrature Modulator and subsequent conventional BPSK or QPSK demodulation of the quadrature modulated signal comprising:

a splitter for receiving an input signal selected from the group of binary, multi-level, and analog signals and combinations thereof and providing a pair of identical data signals; and a signal processor including an in phase and quadrature phase channel each receiving one of said pair of identical data signals, each of said channels including a delay element for receiving said one of said pair of identical data signals and producing a delayed signal;

an amplifier for receiving said delayed signal and producing an amplified data signal;

a filter for receiving said amplified signal and producing a filtered data signal;

such that said signal processor provides in phase and quadrature phase cross correlated data signals for quadrature modulation with a modulated signal suitable for amplification in linear and non-linear mode and adaptable for conventional BPSK or QPSK demodulation.

15. A method of cross correlating an input data signal for use in a quadrature architecture modulator for producing cross correlated in phase and quadrature phase data streams for modulation by a Quadrature Modulator and subsequent conventional BPSK demodulation of the quadrature modulated signal comprising the steps of:

splitting an input signal selected from the group of binary, multi-level, and analog signals and combinations thereof and providing a pair of identical data signals;

delaying each of said pair of identical data signals and producing a pair of delayed signals;

amplifying each of said pair of delayed signals and producing a pair of amplified data signals; and filtering each of said pair of said amplified signals and producing a filtered data signal;

such that said signal processor provides in phase and quadrature phase cross correlated data signals for quadrature modulation characterized by a modulated signal suitable for amplification in linear and non-linear mode and adaptable for conventional BPSK demodulation.

16. A quadrature architecture spectral and power efficient modem comprising:

a splitter for receiving an input signal selected from the group of binary, multi-level, and analog signals and combinations thereof and providing a pair of identical data signals;

a signal processor including an in phase and quadrature phase channel each receiving one of said pair of identical data signals, each of said channels including a delay element for receiving said one of said pair of identical data signals and producing a delayed signal;

an amplifier for receiving said delayed signal and producing an amplified data signal;

a filter for receiving said amplified signal and producing a filtered data signal;

a quadrature modulator for receiving said filtered signals from each of said channels and producing a modulated output signal; and amplification means operated in non-linear mode for maximum power efficiency receiving said modulated output signal and for transmitting a band limited output signal with substantially limited spectral regrowth.

17. A quadrature architecture modem with out of band spectral density attenuated at least 30 dB at 11 MHz away from the carrier frequency for an 11M-chip/sec system comprising:

a splitter for receiving an input signal selected from the group of binary, multi-level, and analog signals and combinations thereof and providing a pair of identical data signals;

a signal processor including an in phase and quadrature phase channel each receiving one of said pair of identical data signals, each of said channels including a delay element for receiving said one of said pair of identical baseband data signals and producing a delayed signal;

an amplifier for receiving said delayed signal and producing an amplified data signal;

a filter for receiving said amplified signal and producing a filtered data signal;

a quadrature modulator for receiving said filtered signals from each of said channels and producing a modulated output signal; and amplification means operated in non-linear mode for receiving said modulated output signal and for transmitting a band limited output signal with spectral regrowth limited to a 30 dB spectral density attenuation.

18. A quadrature architecture modem comprising:

a splitter for receiving an input signal selected from the group of binary, multi-level, and analog signals and combinations thereof and providing a pair of identical data signals;

a signal processor including an in phase and quadrature phase channel each receiving one of said pair of identical data signals, each of said channels including
 a delay element for receiving said one of said pair of identical data signals and producing a delayed signal;
 an amplifier for receiving said delayed signal and producing an amplified data signal;
 a filter for receiving said amplified signal and producing a filtered data signal;

a quadrature modulator for receiving said filtered signals from each of said channels and producing a modulated output signal; and amplification means operated in a non-linear saturation amplification mode for maximum power efficiency receiving said modulated output signal and for transmitting a band limited output signal with out-of-band spectral density attenuated at least 30 dB at N Mhz away from the carrier frequency for N Megachip/sec and N megabit/sec systems.

19. The structure as in claim 18 wherein N is an integer selected from the group consisting of 1, 2, 4, 10, 11 and 22.

20. A cross correlated quadrature architecture signal processor for producing cross correlated in phase and quadrature phase data streams for modulation by a Quadrature Modulator and subsequent demodulation of the quadrature modulated signal in digital, binary, multi-level or analog FM systems comprising:

a variable gain element for reducing the modulation index of said quadrature modulator, said variable gain element receiving an input signal selected from the group of binary, multi-level, and analog signals and combinations thereof and outputting an attenuated input signal;

a splitter for receiving said attenuated input signal and providing a pair of identical data signals; and a signal processor including an in phase and quadrature phase channel each receiving one of said pair of identical data signals, each of said channels including
 a delay element for receiving said one of said pair of identical data signals and producing a delayed signal;
 a function generator for generating Cosine and Sine values for said delayed signal and producing a shaped signal;
 an amplifier for receiving said shaped signal and producing an amplified data signal;
 a filter for receiving said amplified signal and producing a filtered data signal;

such that said signal processor provides in phase and quadrature phase cross correlated data signals for quadrature modulation with a modulated signal suitable for amplification in linear and non-linear mode.

21. A binary phase shift keyed quadrature cross coupled structure suitable for linear and non-linear amplified system applications comprising:

a input port for receiving input data;

a splitter having an input coupled to said input port, and serving to split said input data into in phase (I) and quadrature phase (Q) channel cross coupled datastreams such that said I and Q datastreams are identical, proportional in gain and phase to said input data; and a signal processing network for receiving said I and Q channel datastreams and providing cross-correlated processed in phase and quadrature phase signals, said signal processing network including
 a delay element for delaying one of said I and Q channel datastreams by a selectable time delay;
 amplifiers in the I and Q channel for providing gain adjusted datastreams; and filtering means for filtering said gain adjusted datastreams in the I and Q channels such that said signal processor provides in phase and quadrature phase cross correlated data signals for quadrature modulation with a modulated signal suitable for amplification in linear and non-linear mode.

22. A structure as in claim 21 which further comprises a quadrature modulator for receiving said processed in phase and quadrature phase cross correlated data signals and providing a quadrature modulated output signal.

23. A structure as in claim 21 which further comprises switching means for disconnecting one of said in phase and quadrature phase cross correlated data signals allowing for conventional BPSK, QPSK and offset QPSK modulation.

24. A structure as in claim 21 in which said selectable time delay is one half of a chip duration for a spread spectrum system and one half of a bit duration for a non-spread spectrum system.

25. A Gaussian Filtered Frequency Shift Keyed (GFSK) quadrature cross coupled structure suitable for linear and non-linear amplified system applications comprising:

a input port for receiving input data;

a Gaussian lowpass filter and presetable gain integrator for processing said input data and providing filtered input data;

a splitter having an input coupled to said input port, and serving to split said filtered input data into in phase (I) and quadrature phase (Q) channel cross coupled datastreams such that said I and Q datastreams are identical, proportional in gain and phase to said input data; and a signal processing network for receiving said I and Q channel datastreams and providing processed in phase and quadrature phase signals, said signal processing network including
 a signal processor for varying the modulation index for said signal processing network;
 means for generating Cosine and Sine values for said I and Q channel datastreams;
 a delay element for delaying one of said I and Q channel datastreams by a selectable time delay;
 amplifiers in the I and Q channel for providing gain adjusted datastreams; and
 filtering means for filtering said gain adjusted datastreams in the I and Q channels such that said signal processor provides in phase and quadrature phase cross correlated data signals for quadrature modulation with a modulated signal suitable for amplification in linear and non-linear mode.

26. The structure as in claim 25 wherein said signal processor is selected from the group consisting of a filter, an integrator, and a signal level and gain adjustor.

27. A frequency modulation pre-processor for multistate digital signals suitable for linear and non-linear amplified system applications comprising:

a input port for receiving input data;

a converter for converting said input data into a multilevel N level datastream where N is an integer greater than 1;

a splitter having an input coupled to said input port, and serving to split said multilevel N level datastream into in phase (I) and quadrature phase (Q) channel cross coupled datastreams such that said I and Q datastreams are identical, proportional in gain and phase to said multilevel N level datastream; and a signal processing network for receiving said I and Q channel datastreams and providing cross-correlated processed in phase and quadrature phase signals, said signal processing network including a signal processor for varying the modulation index for said signal processing network;

means for generating Cosine and Sine values for said I and Q channel;

a delay element for delaying one of said I and Q channel datastreams by a selectable time delay;

amplifiers in the I and Q channel for providing gain adjusted datastreams; and filtering means for filtering said gain adjusted datastreams in the I and Q channels such that said signal processor provides in phase and quadrature phase cross correlated data signals for quadrature modulation with a modulated signal suitable for amplification in linear and non-linear mode.

28. A frequency modulation pre-processor for digital signals suitable for linear and non-linear amplified system applications comprising:

a input port for receiving digital input data;

a converter for converting said digital input data converting said digital input signal into a predetermined coded, filtered and processed signal;

a splitter having an input coupled to said input port, and serving to split said input data into in phase (I) and quadrature phase (Q) channel cross-correlated datastreams such that said I and Q datastreams are identical, proportional in gain and phase to said input data; and a signal processing network for receiving said I and Q channel datastreams and providing processed in phase and quadrature phase signals, said signal processing network including a signal processor for presetting the modulation index for said signal processing network;

means for generating Cosine and Sine values for said I and Q channel datastreams;

a delay element for delaying one of said I and Q channel datastreams by a selectable time delay;

amplifiers in the I and Q channel for providing gain adjusted datastreams; and filtering means for filtering said gain adjusted datastreams in the I and Q channels such that said signal processor provides in phase and quadrature phase cross correlated data signals for quadrature modulation with a modulated signal suitable for amplification in linear and non-linear mode.

29. The structure as in claim 28 wherein said signal processor is selected from the group consisting of a filter, an integrator, a delay element, a Cosine and Sine value generator and an amplifier and combinations thereof.

30. A frequency modulation pre-processor for analog signals suitable for linear and non-linear amplified system applications comprising:

a input port for receiving analog input signal;

a splitter having an input coupled to said input port, and serving to split said input signal into in phase (I) and quadrature phase (Q) channel cross coupled signal streams such that said I and Q signal streams are identical, proportional in gain and phase to said input signal; and a signal processing network for receiving said I and Q channel signal streams and providing cross-correlated processed in phase and quadrature phase signals, said signal processing network including a delay element for delaying one of said I and Q channel signal streams by a selectable time delay;

amplifiers in the I and Q channel for providing gain adjusted signal streams; and filtering means for filtering said gain adjusted signal streams in the I and Q channels such that said signal processor provides in phase and quadrature phase cross correlated signals for quadrature modulation with a modulated signal suitable for amplification in linear and non-linear mode.

\* \* \* \* \*